(12) United States Patent
Nozawa et al.

(10) Patent No.: US 10,738,380 B2
(45) Date of Patent: Aug. 11, 2020

(54) DEPOSITION APPARATUS

(71) Applicant: CANON ANELVA CORPORATION, Kawasaki-shi, Kanagawa-ken (JP)

(72) Inventors: Naoyuki Nozawa, Inagi (JP); Nobuo Matsuki, Kawasaki (JP); Reiji Sakamoto, Hino (JP); Masahito Ishihara, Fuchu (JP)

(73) Assignee: CANON ANELVA CORPORATION, Kawasaki-Shi, Kanagawa-Ken (JP)

( * ) Notice: Subject to any disclaimer, the term of this patent is extended or adjusted under 35 U.S.C. 154(b) by 584 days.

(21) Appl. No.: 15/480,870

(22) Filed: Apr. 6, 2017

(65) Prior Publication Data

US 2017/0211179 A1 Jul. 27, 2017

Related U.S. Application Data

(63) Continuation of application No. PCT/JP2015/067908, filed on Jun. 22, 2015.

(30) Foreign Application Priority Data

Oct. 10, 2014 (JP) ................ 2014-209380

(51) Int. Cl.
  *C23C 14/50* (2006.01)
  *C23C 14/56* (2006.01)
  (Continued)

(52) U.S. Cl.
  CPC ............ *C23C 14/50* (2013.01); *C23C 14/022* (2013.01); *C23C 14/04* (2013.01);
  (Continued)

(58) Field of Classification Search
  None
  See application file for complete search history.

(56) References Cited

U.S. PATENT DOCUMENTS 4,261,808 A * 4/1981 Walter .................. C23C 14/568
                                                  204/298.25
6,678,143 B2   1/2004 Masuda et al.
(Continued)

FOREIGN PATENT DOCUMENTS

JP   2001-185546 A    7/2001
JP   2005-320599      11/2005
(Continued)

OTHER PUBLICATIONS

Notice of Allowance issued in corresponding Korean Patent Application No. 10-2017-7011314, dated Mar. 13, 2019 (2 pages).
(Continued)

*Primary Examiner* — John J Brayton
(74) *Attorney, Agent, or Firm* — Buchanan Ingersoll & Rooney PC

(57) ABSTRACT

A deposition apparatus includes a chamber, a holding unit configured to hold a substrate in the chamber, a driving unit configured to move the holding unit holding the substrate such that the substrate passes through a deposition area in the chamber, a deposition unit configured to form a film on the substrate passing through the deposition area by supplying a deposition material to the deposition area, and a cooling unit configured to cool the holding unit.

17 Claims, 24 Drawing Sheets

(51) Int. Cl.

| | |
|---|---|
| *C23C 14/34* | (2006.01) |
| *C23C 14/54* | (2006.01) |
| *H01J 37/34* | (2006.01) |
| *C23C 14/04* | (2006.01) |
| *C23C 14/02* | (2006.01) |
| *H01L 21/677* | (2006.01) |
| *H01L 21/67* | (2006.01) |

(52) U.S. Cl.
CPC ........ *C23C 14/3464* (2013.01); *C23C 14/541* (2013.01); *C23C 14/566* (2013.01); *C23C 14/568* (2013.01); *H01J 37/3411* (2013.01); *H01J 37/3488* (2013.01); *H01L 21/6776* (2013.01); *H01L 21/67109* (2013.01); *H01L 21/67201* (2013.01); *H01L 21/67213* (2013.01); *H01L 21/67712* (2013.01)

(56) References Cited

U.S. PATENT DOCUMENTS

| | | | |
|---|---|---|---|
| 7,988,398 B2 * | 8/2011 | Hofmeister | ....... H01L 21/67161 156/345.31 |
| 2003/0107865 A1 | 6/2003 | Masuda et al. | |
| 2011/0253953 A1 * | 10/2011 | Tanaka | ................. B65G 49/061 254/95 |
| 2012/0125765 A1 | 5/2012 | Ohmi et al. | |

FOREIGN PATENT DOCUMENTS

| | | |
|---|---|---|
| JP | 2006-299358 A | 11/2006 |
| JP | 2014-028999 A | 2/2014 |
| JP | 2014-058698 A | 4/2014 |
| KR | 10-2002-0046214 A | 6/2002 |
| KR | 10-2006-0049437 A | 5/2006 |
| KR | 10-2012-0031520 A | 4/2012 |

OTHER PUBLICATIONS

Office Action (Notice of Preliminary Rejection) dated Nov. 5, 2018, by the Korean Patent Office in corresponding Korean Patent Application No. 10-2017-7011314, and an English Translation of the Office Action. (16 pages).

International Search Report (PCT/ISA/210) dated Aug. 25, 2015, by the Japanese Patent Office as the International Searching Authority for International Application No. PCT/JP2015/067908, (5 pages).

Written Opinion (PCT/ISA/237) dated Aug. 25, 2015, by the Japanese Patent Office as the International Searching Authority for International Application No. PCT/JP2015/067908 (4 pages).

International Preliminary Report on Patentability (PCT/IPEA/409) Apr. 11, 2016 for International Application No. PCT/JP2015/067908 (14 pages).

* cited by examiner

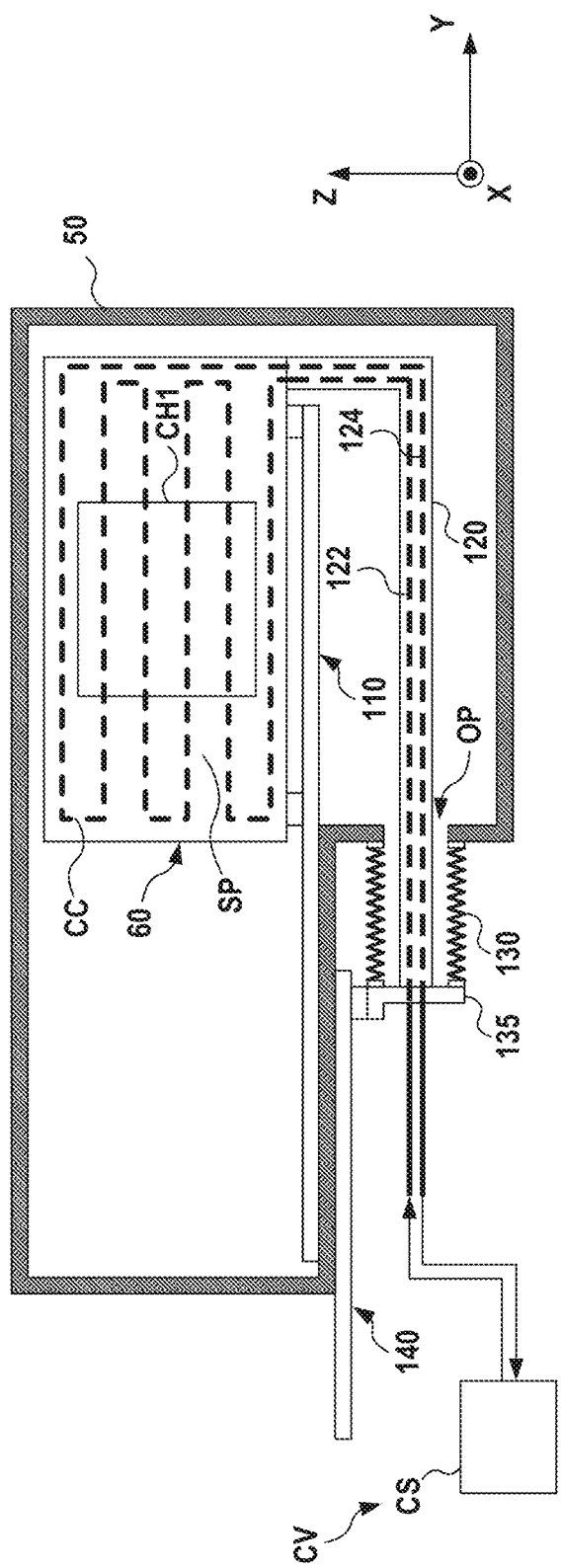
F I G. 2A

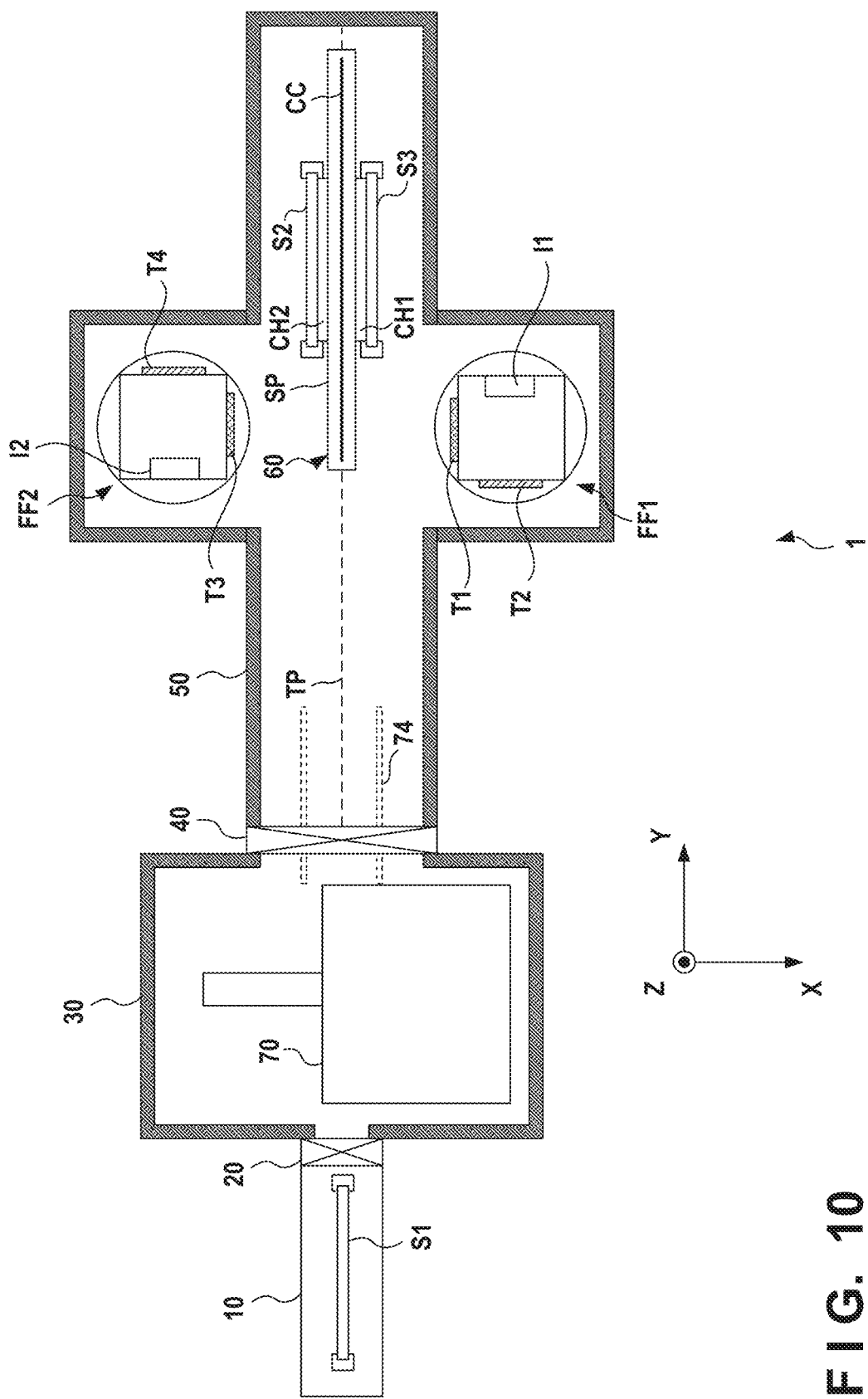
F I G. 10

DEPOSITION APPARATUS

This application is a continuation of International Patent Application No. PCT/JP2015/067908 filed on Jun. 22, 2015, and claims priority to Japanese Patent Application No. 2014-209380 filed on Oct. 10, 2014, the entire content of both of which is incorporated herein by reference.

BACKGROUND OF THE INVENTION

Field of the Invention

The present invention relates to a deposition apparatus for forming a film on a substrate.

Description of the Related Art

In the manufacture of an electronic device, various films can be formed on a substrate by a plasma process such as plasma PVD or plasma CVD. For example, PTL 1 describes a deposition apparatus that forms a film on a substrate while transporting the substrate. In such a deposition apparatus, a substrate under a process may be heated beyond an appropriate temperature for the process or deformed. Particularly in a resin substrate or the like, the deformation amount can be large and pose a problem.

On the other hand, there is a deposition apparatus that forms films on both of the two surfaces of a substrate. In a deposition apparatus described in PTL 2, after a deposition unit forms a film on one surface of a substrate, the substrate is unloaded from the deposition unit and moved to a carrier rotation unit. The carrier rotation unit rotates a carrier placement member holding the substrate by 180°. The rotated substrate is returned to the deposition unit, and the deposition unit forms a film on the other surface. In this deposition apparatus, the throughput is low because of an increase in the transportation count and the transportation time. Additionally, in a case in which a simultaneous process of a plurality of substrates is enabled to improve the throughput, a problem that one deposition unit forms a film on another deposition unit arises.

CITATION LIST

Patent Literature

PTL 1: Japanese Patent Laid-Open No. 2014-58698
PTL 2: Japanese Patent Laid-Open No. 2014-28999

SUMMARY OF THE INVENTION

A first aspect of the present invention provides a technique advantageous in suppressing deformation of a substrate in a deposition apparatus that forms a film on a substrate while transporting the substrate.

The first aspect of the present invention is directed to a deposition apparatus for forming a film on each of a first surface and a second surface of each of a plurality of substrates each having the first surface and the second surface, and the apparatus comprises: a chamber; a holding unit including a first chuck and a second chuck, which are located on sides opposite to each other, and configured to, in the chamber, hold a side of the second surface of a first substrate by the first chuck and hold a side of the first surface of a second substrate by the second chuck; a driving unit configured to move the holding unit such that the first substrate and the second substrate respectively held by the first chuck and the second chuck pass through a deposition area in the chamber; a first deposition unit configured to form a film on the first surface of the first substrate held by the first chuck; a second deposition unit configured to form a film on the second surface of the second substrate held by the second chuck; an operation mechanism configured to, after the film is formed by the first deposition unit on the first surface of the first substrate with the side of the second surface held by the first chuck, operate the first substrate such that the side of the first surface of the first substrate is held by the second chuck; and a cooling unit configured to cool the holding unit.

A second aspect of the present invention provides a technique advantageous in improving throughput.

The second aspect of the present invention is directed to a deposition apparatus for forming a film on each of a first surface and a second surface of each of a plurality of substrates each having the first surface and the second surface, and the apparatus comprises: a chamber; a holding unit including a first chuck and a second chuck, which are located on sides opposite to each other, and configured to, in the chamber, hold a side of the second surface of a substrate by the first chuck and hold a side of the first surface of a substrate by the second chuck; a driving unit configured to move the holding unit such that the substrates respectively held by the first chuck and the second chuck pass through a deposition area in the chamber; a first deposition unit configured to form a film on the substrate held by the first chuck; a second deposition unit configured to form a film on the substrate held by the second chuck; and an operation mechanism configured to operate the substrate with the side of the second surface held by the first chuck and the film formed on the first surface by the first deposition unit such that the side of the first surface is held by the second chuck.

A third aspect of the present invention provides a technique advantageous in solving a problem that arises in a case in which a simultaneous process of a plurality of substrates is enabled to improve throughput.

The third aspect of the present invention is directed to a deposition apparatus and the apparatus comprises: a chamber; a holding unit including a first chuck and a second chuck, which are located on sides opposite to each other, and configured to hold substrates by the first chuck and the second chuck, respectively, in the chamber; a driving unit configured to move the holding unit such that the substrates respectively held by the first chuck and the second chuck pass through a deposition area in the chamber; a first deposition unit configured to form a film on the substrate held by the first chuck; and a second deposition unit configured to form a film on the substrate held by the second chuck, wherein the holding unit includes a separation unit configured to separate a space on a side of the first deposition unit and a space on a side of the second deposition unit such that the first deposition unit and the second deposition unit do not face each other in a movable range of the holding unit during the film is formed.

Further features of the present invention will become apparent from the following description of exemplary embodiments (with reference to the attached drawings).

BRIEF DESCRIPTION OF THE DRAWINGS

FIG. 2A is a sectional view showing part of the deposition apparatus according to one embodiment of the present invention taken along a plane along the vertical direction;

FIG. 10 is a view for explaining a detailed example of an operation according to one embodiment of the present invention;

DESCRIPTION OF THE EMBODIMENTS

The present invention will now be described with reference to the accompanying drawings using an exemplary embodiment.

Figure 1:
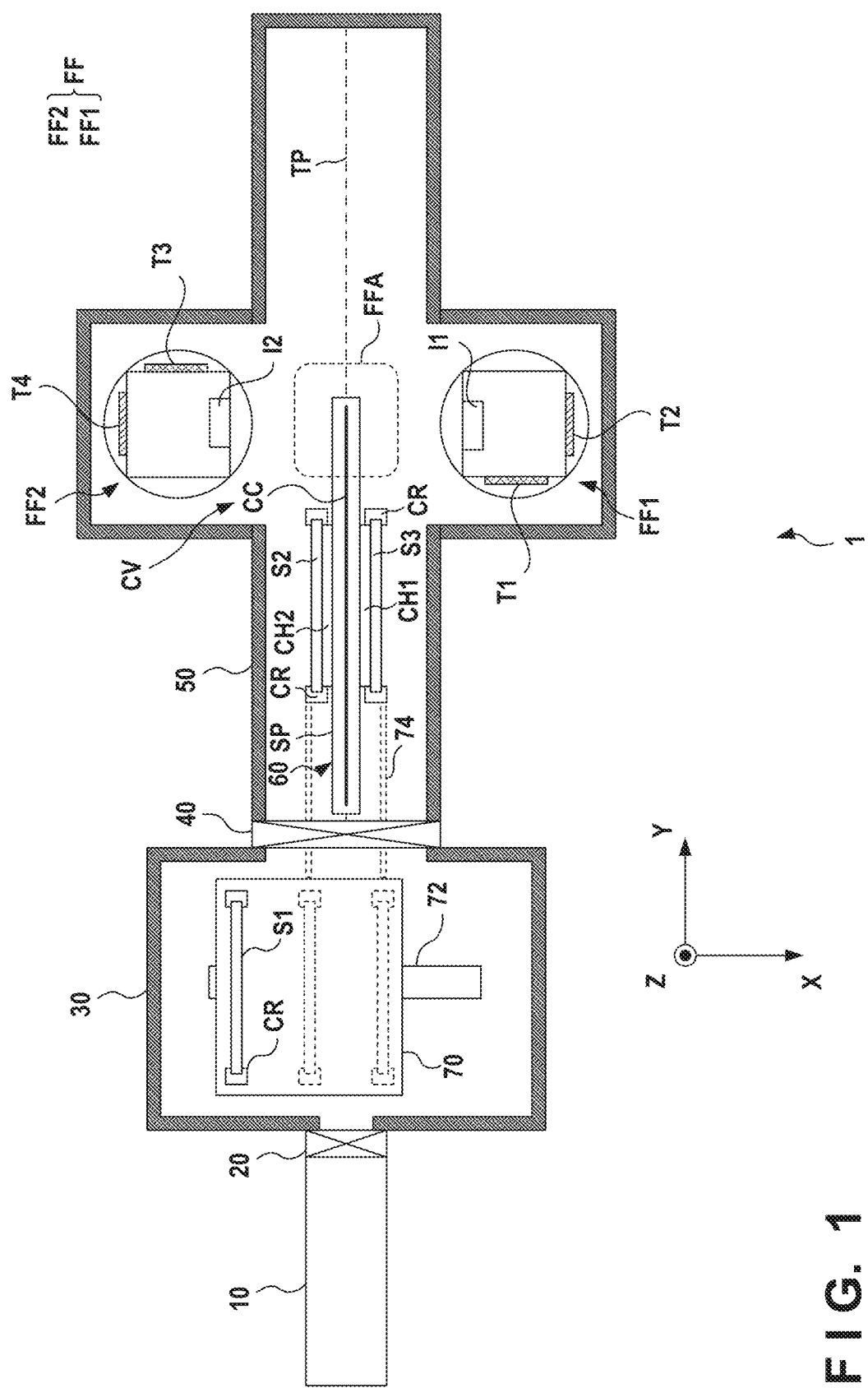
FIG. 1 is a schematic sectional view showing a deposition apparatus according to one embodiment of the present invention taken along a plane parallel to a horizontal plane.
Figure 2B:
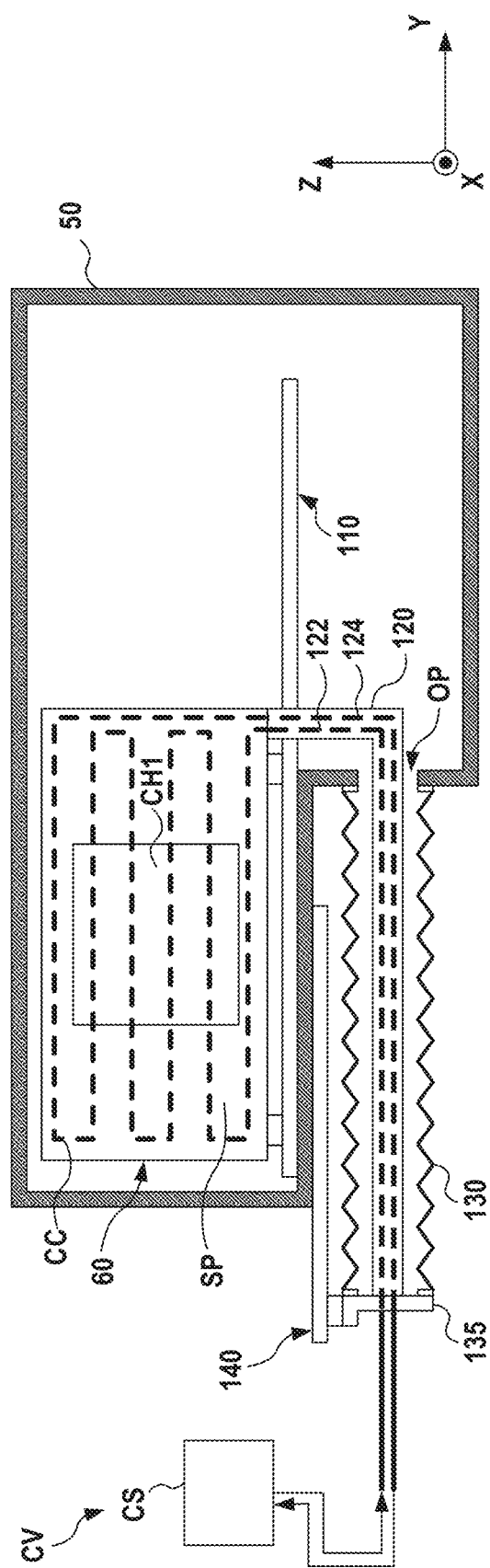
FIG. 2B is a sectional view showing part of the deposition apparatus according to one embodiment of the present invention taken along a plane along the vertical direction.

FIG. 1 is a schematic sectional view showing a deposition apparatus 1 according to one embodiment of the present invention taken along a plane parallel to a horizontal plane. FIGS. 2A and 2B are sectional views showing part of the deposition apparatus 1 taken along a plane along the vertical direction. Here, the XY plane is a plane parallel to the horizontal plane, and the Z-axis is an axis parallel to the vertical direction. The deposition apparatus 1 is configured as an apparatus that forms a film on a substrate S (S1, S2, . . . . ) In this specification, symbols like S1, S2, S3, and S4 are used to discriminate a plurality of substrates from each other. If the substrates need not be discriminated from each other, they are described as the substrates S. Each substrate S can be transported and processed in a state in which it is held by, for example, a carrier CR.

The deposition apparatus 1 can include a platform 10 and a load lock chamber 30 as well as a chamber (also called a deposition chamber or main chamber) 50 used to perform a process of forming a film on the substrate S (S1, S2, . . . . ) The platform 10 can be used to transfer/receive the substrate S to/from another apparatus. A valve 20 is provided between the platform 10 and the load lock chamber 30, and a valve 40 is provided between the load lock chamber 30 and the chamber 50.

The deposition apparatus 1 can include a holding unit 60 that holds the substrate S in the chamber 50. The holding unit 60 can include a first chuck CH1 and a second chuck CH2, which are arranged on sides opposite to each other. Each of the first chuck CH1 and the second chuck CH2 can include, for example, an electrostatic chuck or a mechanical chuck. The deposition apparatus 1 can include a driving unit 110 that moves the holding unit 60 holding the substrate S along a moving path TP such that the substrate S passes through a deposition area FFA in the chamber 50. The driving unit 110 can include, for example, a linear motor or a ball screw mechanism. The moving path TP is parallel to, for example, the process target surface of the substrate S.

The deposition apparatus 1 can include a deposition unit FF that forms a film on the substrate S passing through the deposition area FFA by supplying a deposition material to the deposition area FFA. Here, the deposition area FFA is an area where a film is formed on the substrate S. The deposition unit FF can be configured to simultaneously form films on the substrate S (to be referred to as a first substrate for the descriptive convenience) held by the first chuck CH1 and another substrate S (to be referred to as a second substrate for the descriptive convenience) held by the second chuck CH2. Each of the first substrate and the second substrate has a first surface and a second surface, which are surfaces on sides opposite to each other. For each of the first substrate and the second substrate, a film can be formed on the first surface by the deposition unit FF in a state in which the side of the second surface is held by the first chuck CH1, and a film can be formed on the second surface by the deposition unit FF in a state in which the side of the first surface is held by the second chuck CH2. This arrangement is advantageous in improving throughput. This arrangement is also advantageous in downsizing the deposition apparatus 1.

The deposition unit FF can be configured to form a film on the substrate S in both a case in which the substrate S moves along the moving path TP in a first direction (for example, the +Y direction) and a case in which the substrate S moves along the moving path TP in a second direction (for example, the −Y direction) reverse to the first direction. The deposition unit FF can include a first deposition unit FF1 that forms a film on the substrate S held by the first chuck CH1, and a second deposition unit FF2 that forms a film on the substrate S held by the second chuck CH2. The deposition area FFA can be arranged between the first deposition unit FF1 and the second deposition unit FF2.

The deposition unit FF can include a plasma generation unit that generates a plasma so as to supply a deposition material to the deposition area FFA. As a more detailed example, the deposition unit FF can be configured to form a film on the substrate S by sputtering. The deposition unit FF configured to form a film by sputtering can generate a plasma by, for example, applying a voltage between a target and a substrate. The deposition unit FF may be configured to form a film on the substrate S by, for example, CVD.

In an example, the first deposition unit FF1 can be configured to form a film on the substrate S by sputtering. The first deposition unit FF1 can include a plurality of targets T1 and T2 and form a plurality of films (typically, a plurality of types of films) on the substrate S. The first deposition unit FF1 may further include an ion gun I1. The ion gun I1 irradiates the substrate S with ions. The substrate S irradiated with ions can be, for example, planarized, roughened, cleaned, and/or activated.

Similarly, the second deposition unit FF2 can be configured to form a film on the substrate S by sputtering. The second deposition unit FF2 can include a plurality of targets T3 and T4 and form a plurality of films (typically, a plurality of types of films) on the substrate S. The second deposition unit FF2 may further include an ion gun I2. The ion gun I2 irradiates the substrate S with ions. The substrate S irradiated with ions can be, for example, planarized, roughened, cleaned, and/or activated.

As described above, the arrangement capable of performing a plurality of types of processes by one deposition unit is advantageous in downsizing the deposition apparatus 1. In this example, a holder that holds a plurality of targets and an ion gun is rotated, thereby implementing switching of processes.

The holding unit 60 can include a separation unit SP that separates the space on the side of the first deposition unit FF1 and the space on the side of the second deposition unit FF2 such that the first deposition unit FF1 and the second deposition unit FF2 do not face each other in the movable range (the range in which the holding unit 60 is driven by the driving unit 110), preferably, throughout the movable range of the holding unit 60 during a film is formed on the substrate S.

The deposition apparatus 1 can include a cooling unit CV that cools the holding unit 60. The cooling unit CV can include a coolant channel CC arranged in the holding unit 60, and a supply unit CS that supplies a coolant to the coolant channel CC. The cooling unit CV can further include tubes 122 and 124 that connect the supply unit CS and the coolant channel CC. When the holding unit 60 is cooled by the cooling unit CV, the substrate S held by the holding unit 60 is cooled and, for example, deformation of the substrate S or the like can be suppressed.

The deposition apparatus 1 can further include a bellows 130 with one end connected to an opening OP provided in the chamber 50 and the other end closed by a closing member 135, and a hollow member 120 that connects the holding unit 60 and the closing member 135. The supply unit CS can be configured to supply a coolant from outside of the chamber 50 (typically, the space of the atmospheric pressure) to the holding unit 60 arranged in the chamber 50 via the tubes 122 and 124 arranged in the hollow member 120. A cable that supplies power and signals to the first chuck CH1 and the second chuck CH2 can also be arranged in the hollow member 120.

The deposition apparatus 1 can include a second driving unit 140 that moves the closing member 135 in accordance with the operation of the driving unit 110 to move the holding unit 60 along the moving path TP. The second driving unit 140 can include, for example, a linear motor or a ball screw mechanism.

In the load lock chamber 30, the unprocessed substrates S provided from the platform 10 and the substrates S after deposition provided from the chamber 50 are operated by an operation mechanism 72. The operation mechanism 72 drives, for example, a container 70 capable of holding a plurality of substrates S along the X-axis. The substrates S are transported between the platform 10 and the load lock chamber 30 by a transportation mechanism (not shown). The substrates S are transported between the load lock chamber 30 and the chamber 50 by a transportation mechanism 74. The operation mechanism 72 operates, for example, the substrate S with the side of the second surface held by the first chuck CH1 and a film formed on the first surface by the first deposition unit FF1 such that the side of the first surface is held by the second chuck CH2.

A detailed example of the operation of the deposition apparatus 1 will be described below with reference to FIGS. 3 to 23. To discriminate the substrates S from each other, they will be referred to as the substrates S1, S2, S3, and S4 hereinafter. Each of the substrates S1, S2, S3, and S4 has a first surface and a second surface as process target surfaces on sides opposite to each other. The first surface is a surface facing the +X direction, and the second surface is a surface facing the −X direction. In the state shown in FIG. 3, the substrate S1 has films already formed on the first surface and the second surface in the chamber 50 and is unloaded from the chamber 50 and stored in the container 70 in the load lock chamber 30. For the substrate S2, a film is already formed on the first surface in the chamber 50, but no film is formed yet on the second surface in the chamber 50. For the substrate S3, no film is formed yet on either of the first surface and the second surface in the chamber 50.

Figure 3:
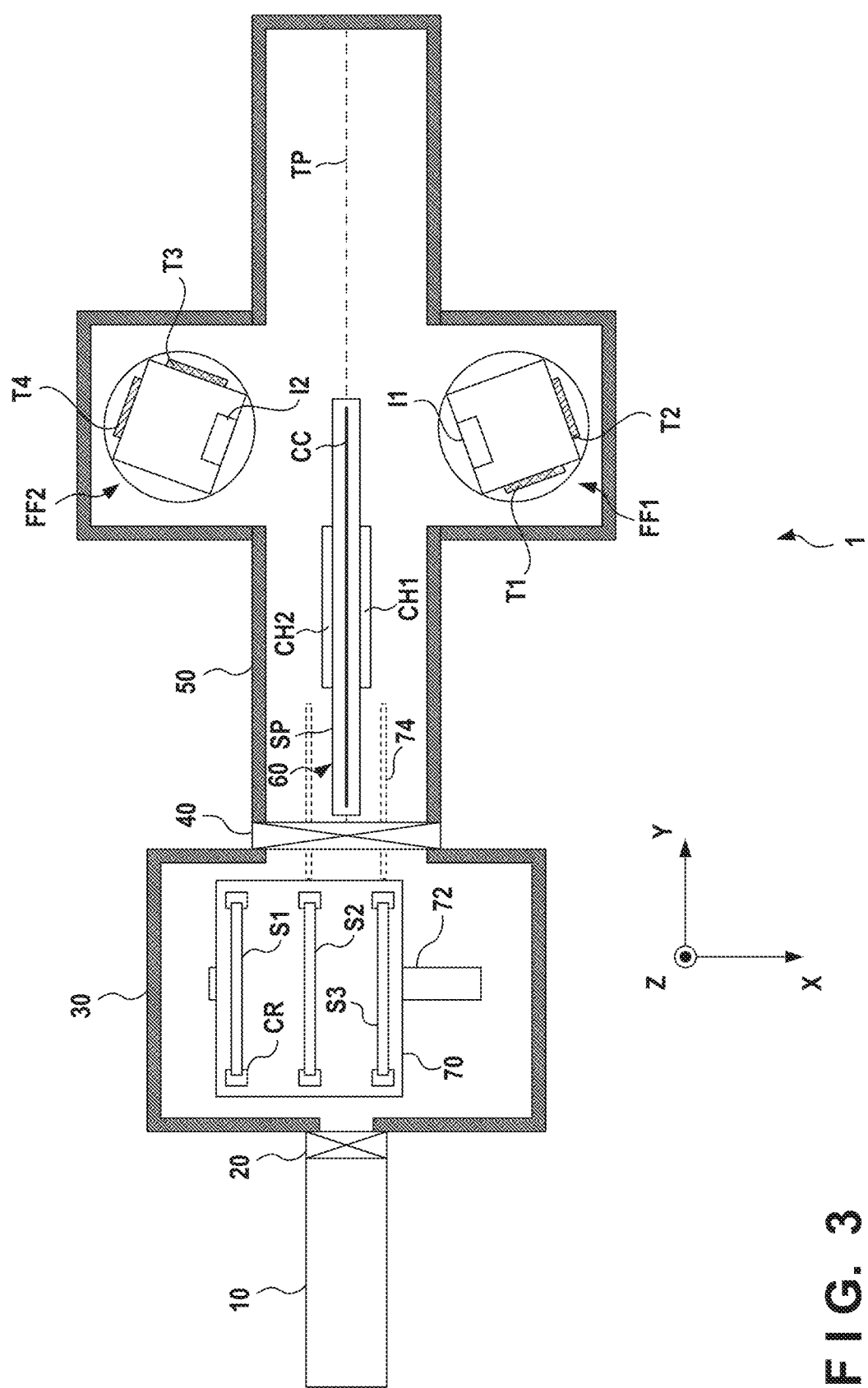
FIG. 3 is a view for explaining a detailed example of an operation according to one embodiment of the present invention.
Figure 4:
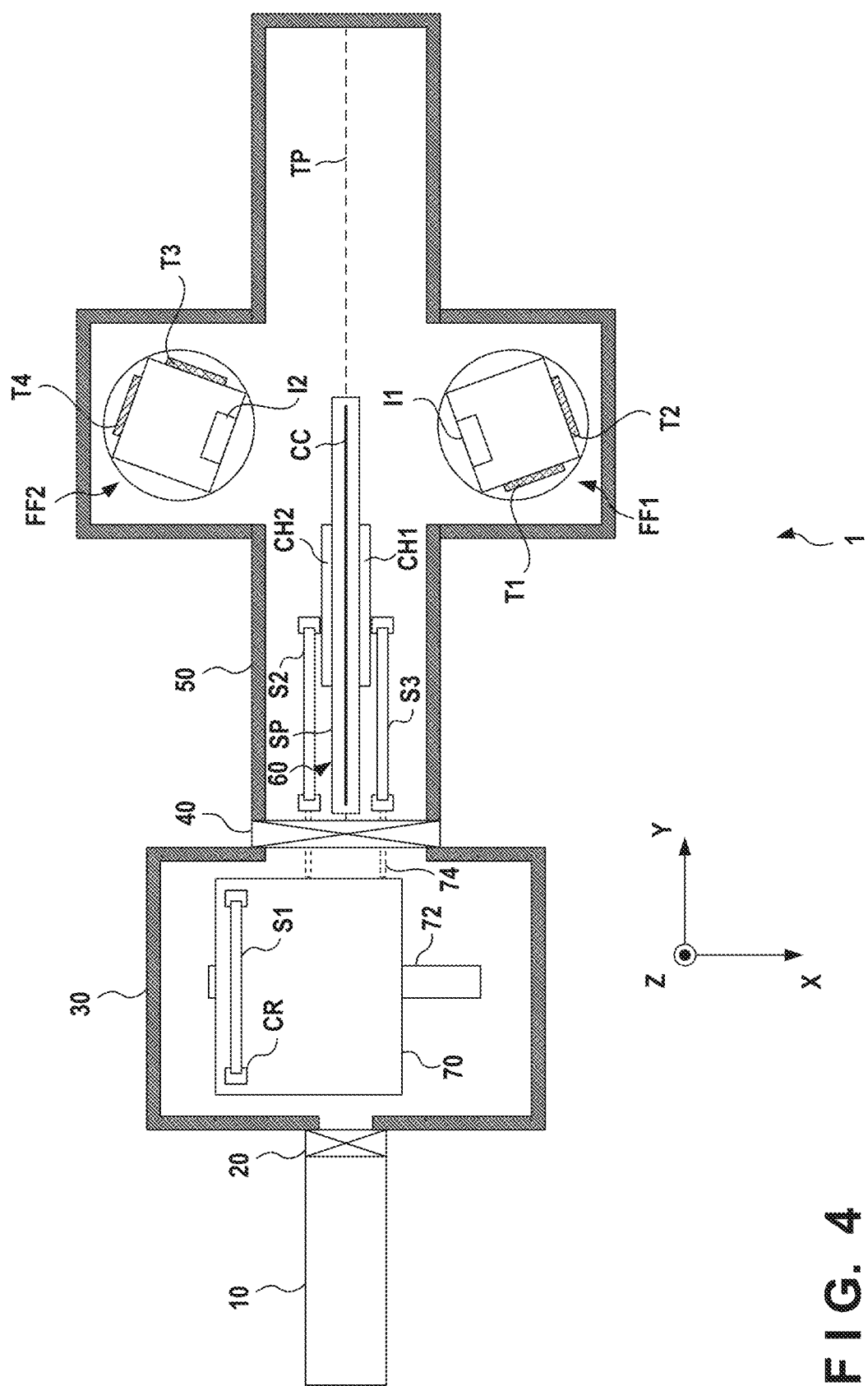
FIG. 4 is a view for explaining a detailed example of an operation according to one embodiment of the present invention.
Figure 5:
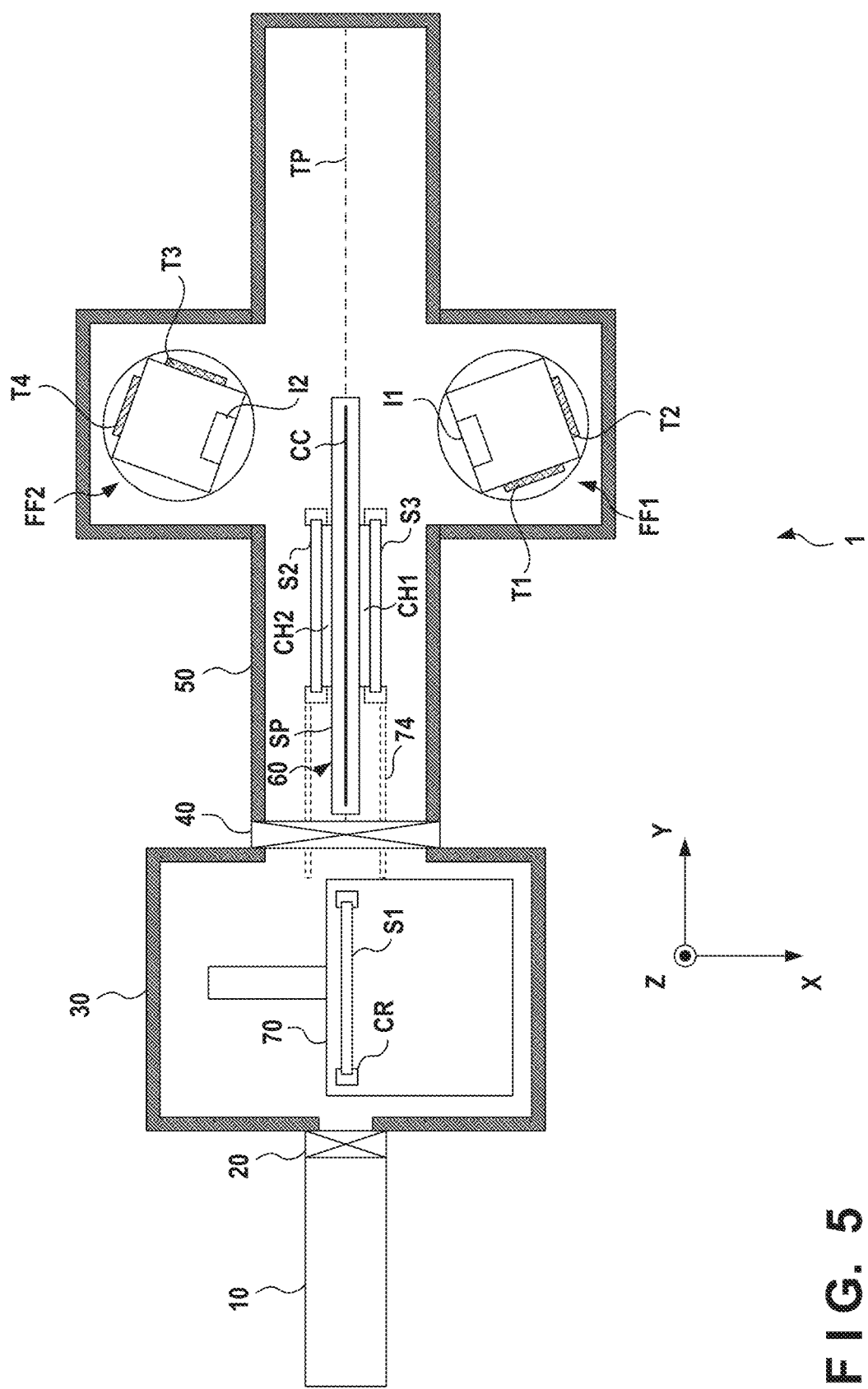
FIG. 5 is a view for explaining a detailed example of an operation according to one embodiment of the present invention.

First, as schematically shown in FIGS. 3, 4, and 5, to simultaneously form films on the first surface of the substrate S3 and the second surface of the substrate S2, the substrates S3 and S2 in the container 70 are transported to the first chuck CH1 and the second chuck CH2 by the transportation mechanism 74 and held by the first chuck CH1 and the second chuck CH2, respectively. Here, the second surface of the substrate S3 is held by the first chuck CH1, and the first surface of the substrate S2 is held by the second chuck CH2.

Figure 6:
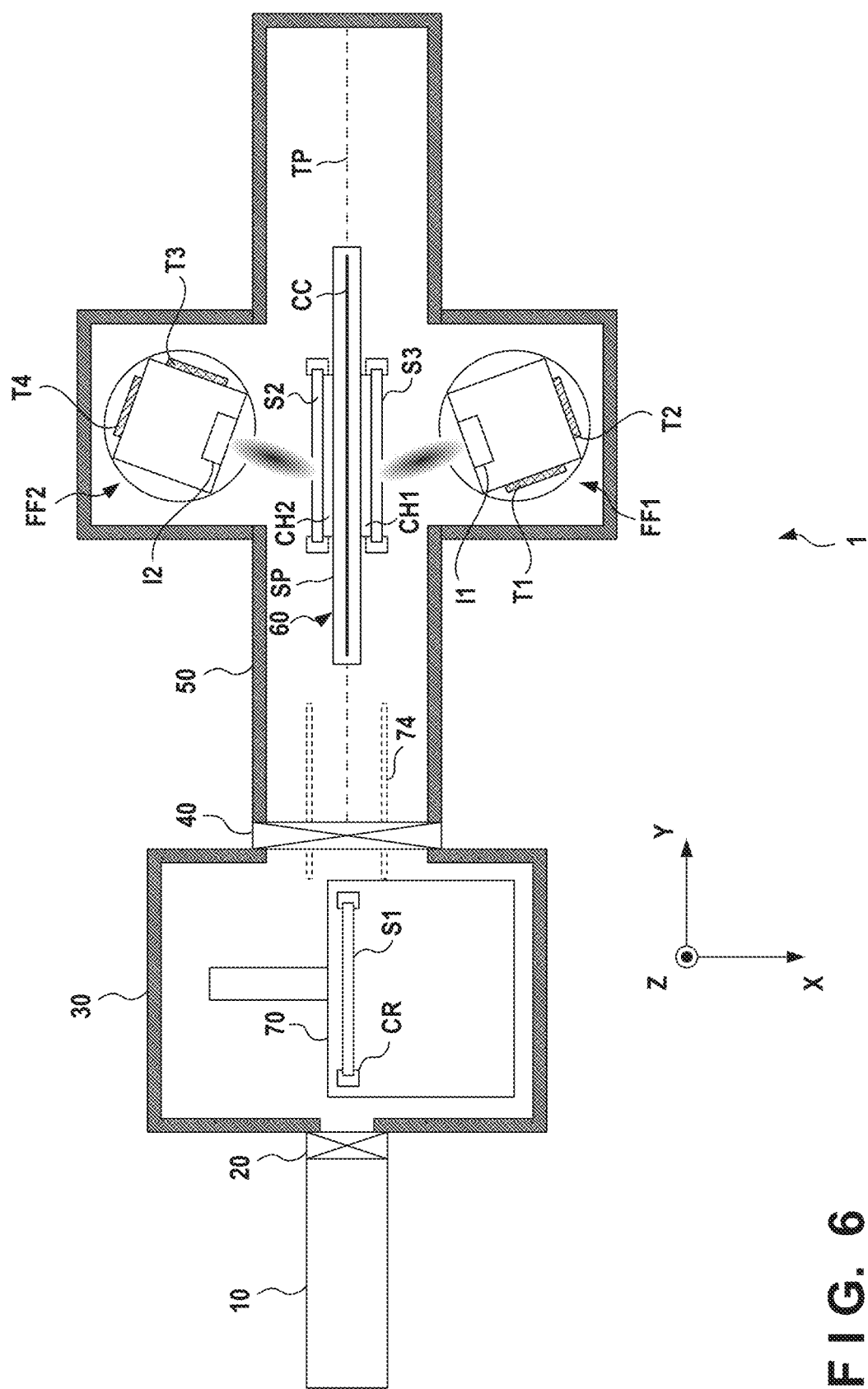
FIG. 6 is a view for explaining a detailed example of an operation according to one embodiment of the present invention.
Figure 7:
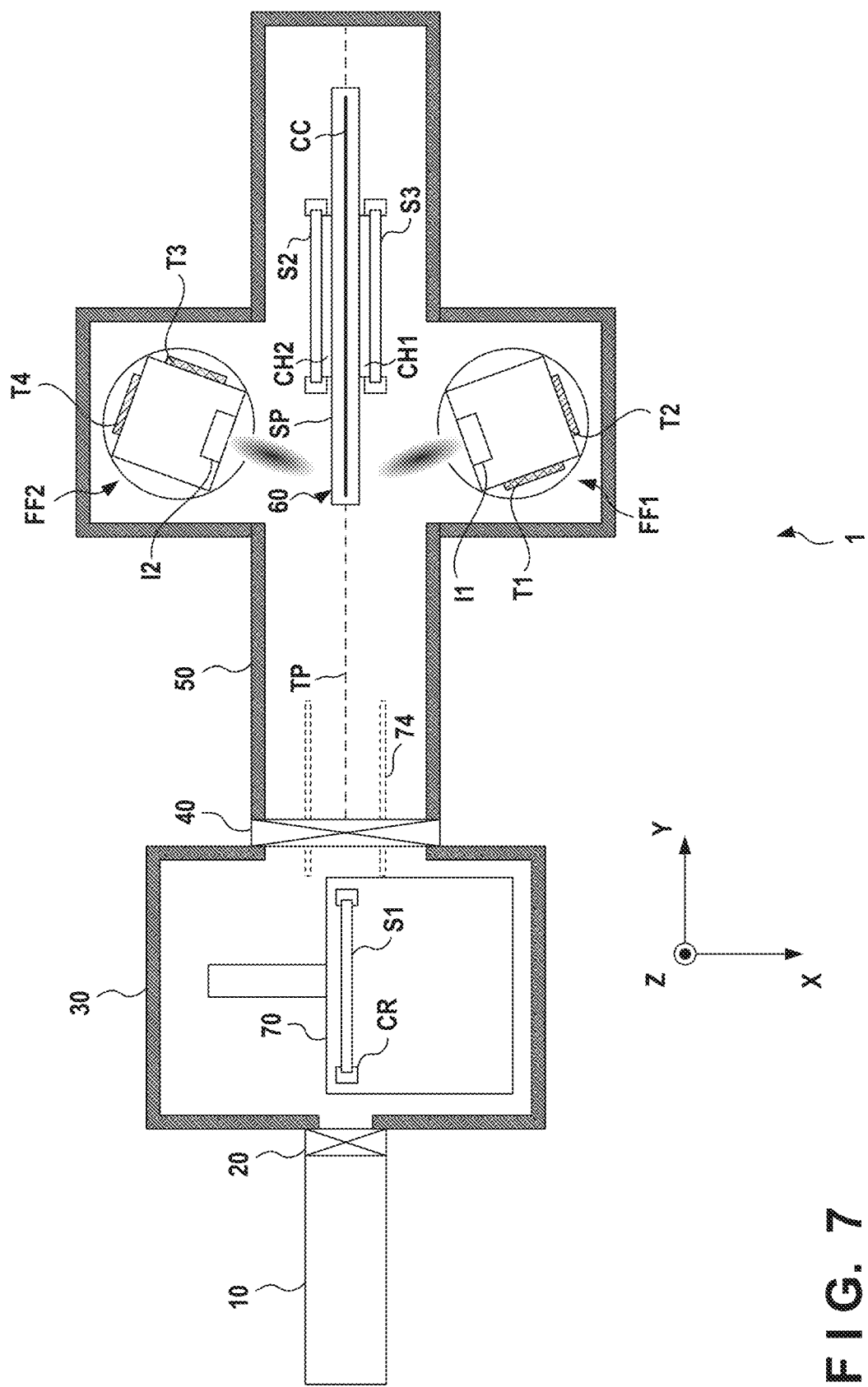
FIG. 7 is a view for explaining a detailed example of an operation according to one embodiment of the present invention.

Next, as schematically shown in FIGS. 6 and 7, while causing the ion guns I1 and I2 to emit ions, the driving unit 110 moves the holding unit 60 holding the substrates S3 and S2 along the moving path TP in the +Y direction (first direction). The first surface of the substrate S3 and the second surface of the substrate S2 are thus, for example, planarized, roughened, cleaned, and/or activated.

Figure 8:
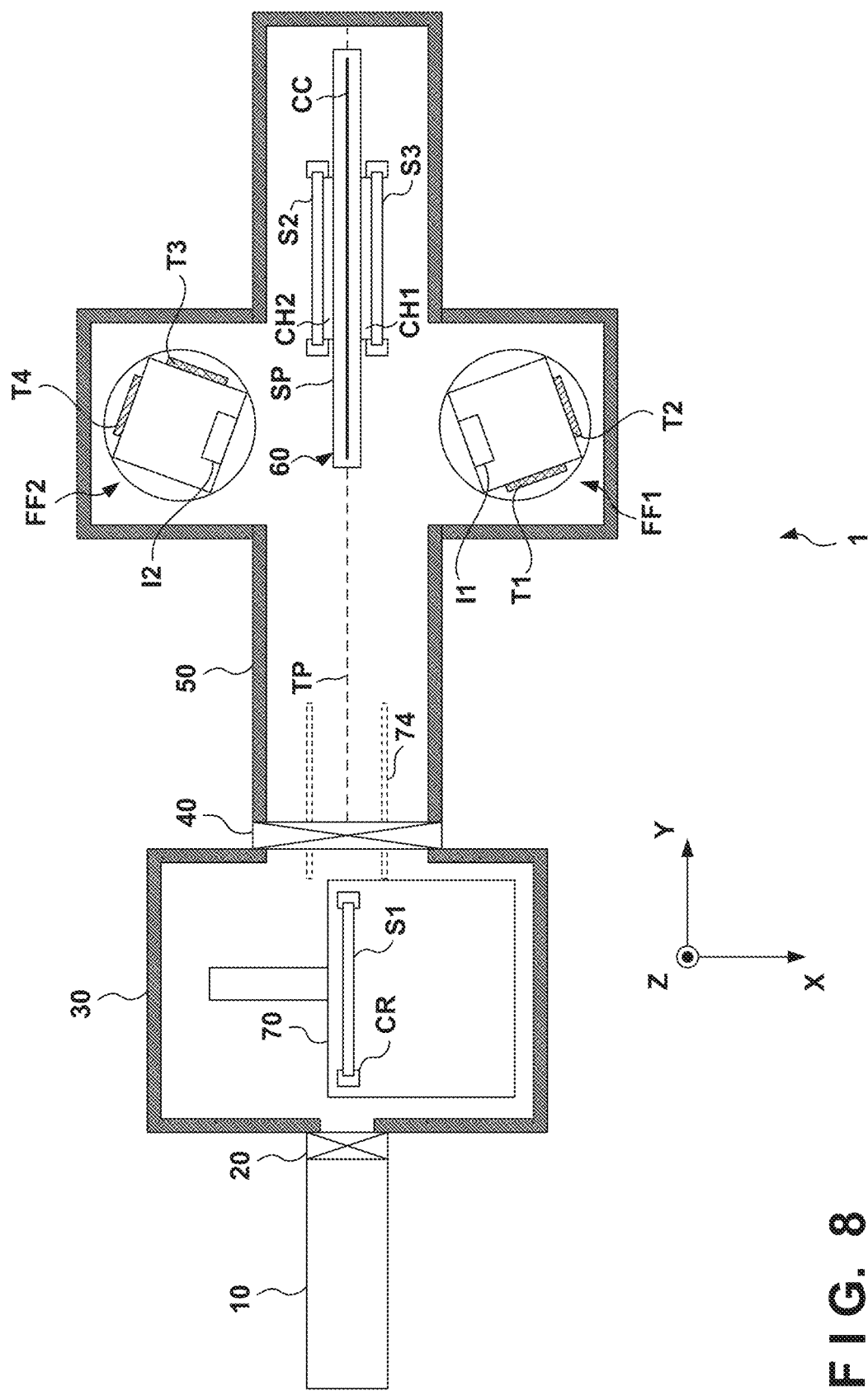
FIG. 8 is a view for explaining a detailed example of an operation according to one embodiment of the present invention.
Figure 9:
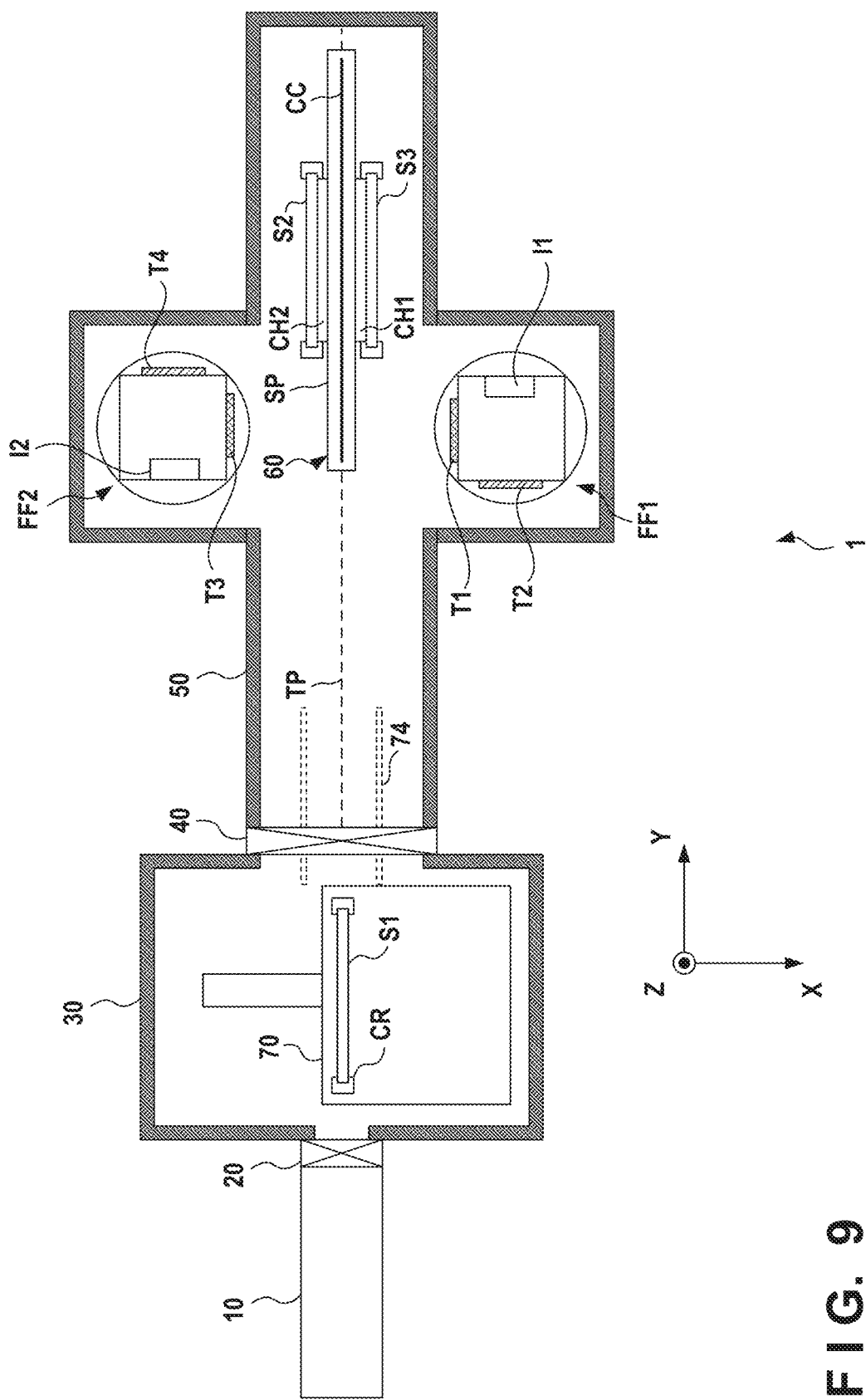
FIG. 9 is a view for explaining a detailed example of an operation according to one embodiment of the present invention.

Next, as schematically shown in FIG. 8, ion emission from the ion guns I1 and I2 is stopped. After that, as schematically shown in FIG. 9, the targets T1 and T3 are directed to the deposition area. Then, as schematically shown in FIG. 10, the substrate S1 with the films already formed on the first surface and the second surface is discharged from the load lock chamber 30 to the platform 10 via the valve 20. Note that before the discharge, to discharge the substrate S1 from the load lock chamber 30 to the platform 10, the container 70 is operated by the operation mechanism 72, and the load lock chamber 30 is adjusted to the atmospheric pressure.

Figure 11:
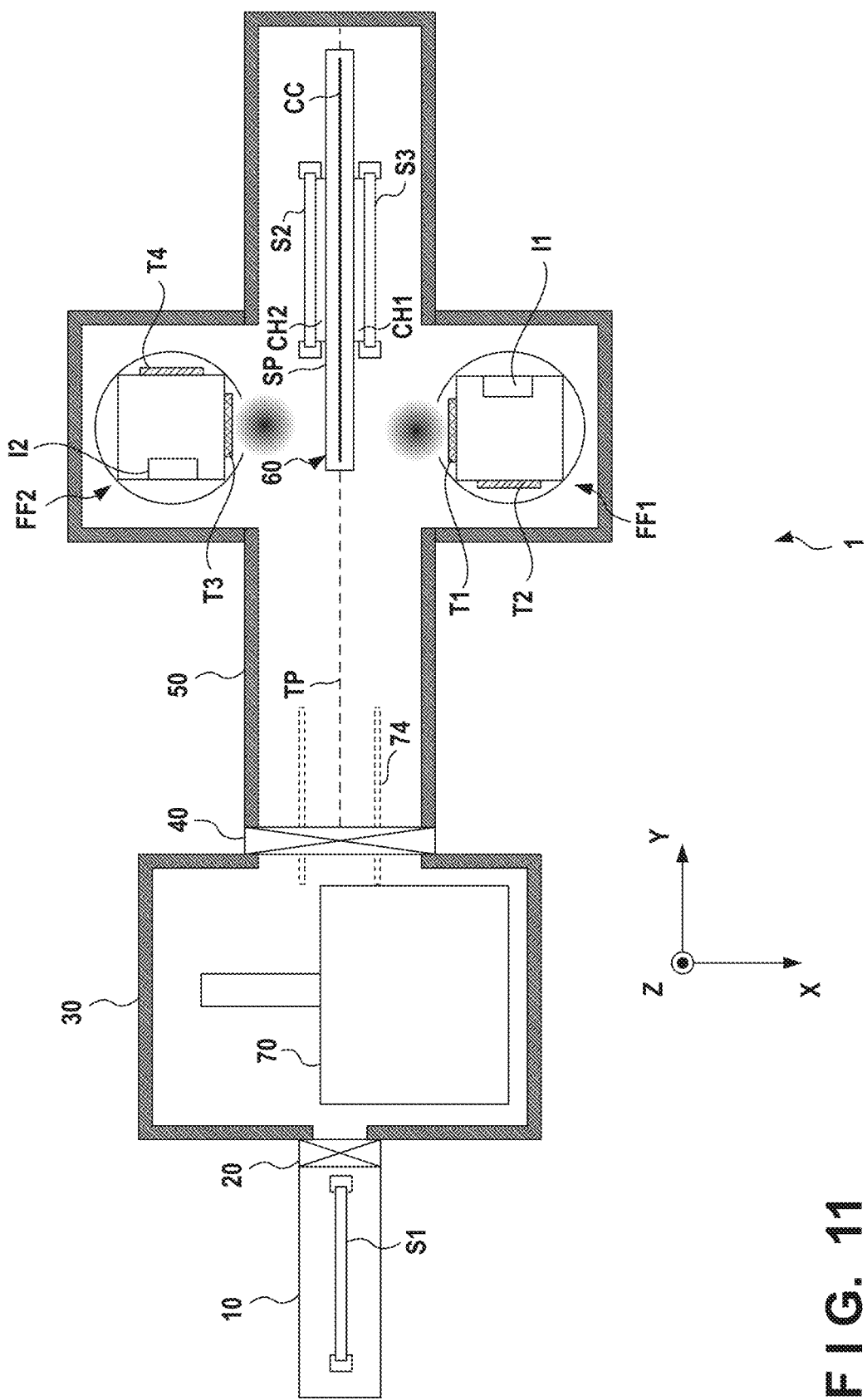
FIG. 11 is a view for explaining a detailed example of an operation according to one embodiment of the present invention.
Figure 12:
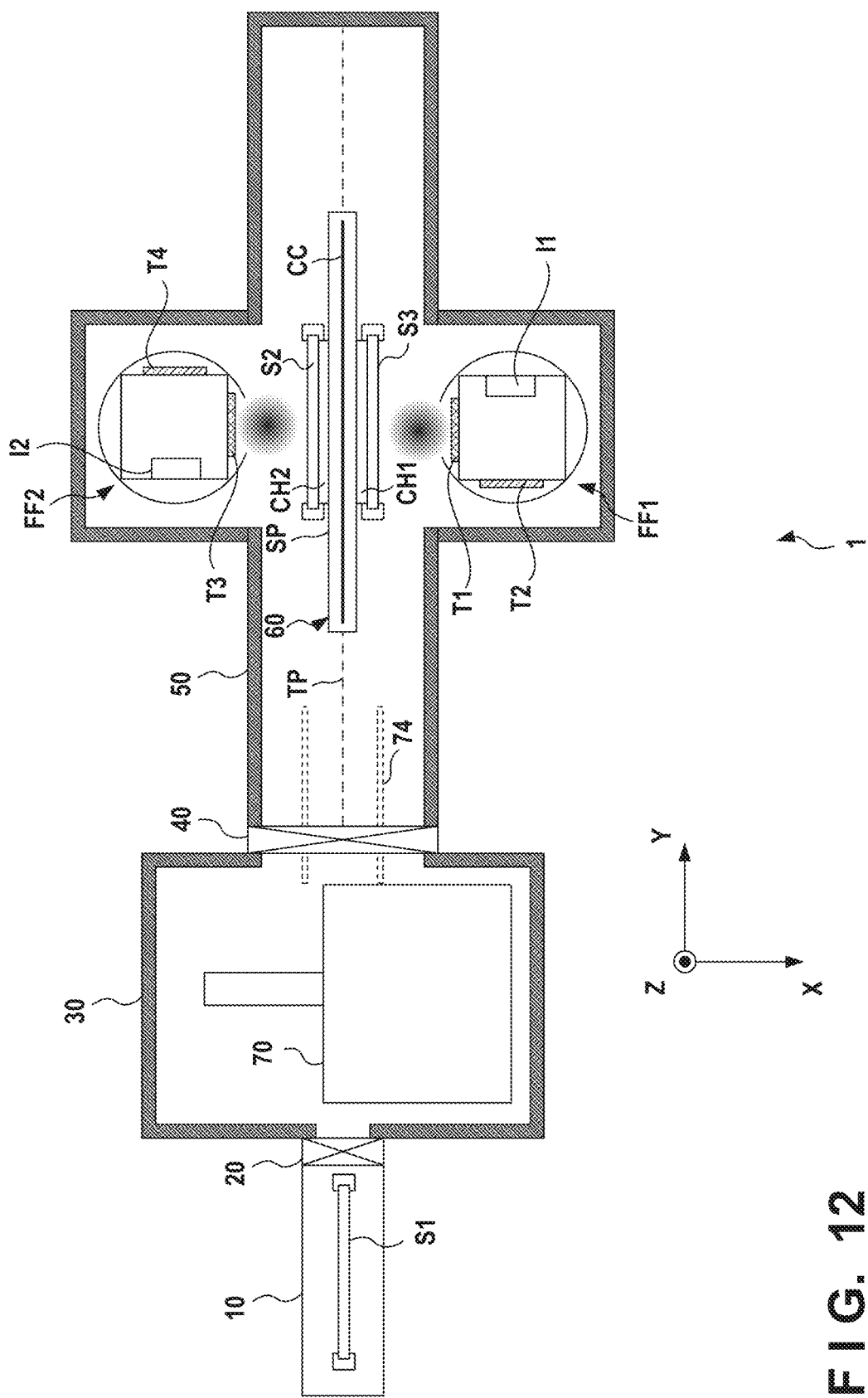
FIG. 12 is a view for explaining a detailed example of an operation according to one embodiment of the present invention.
Figure 13:
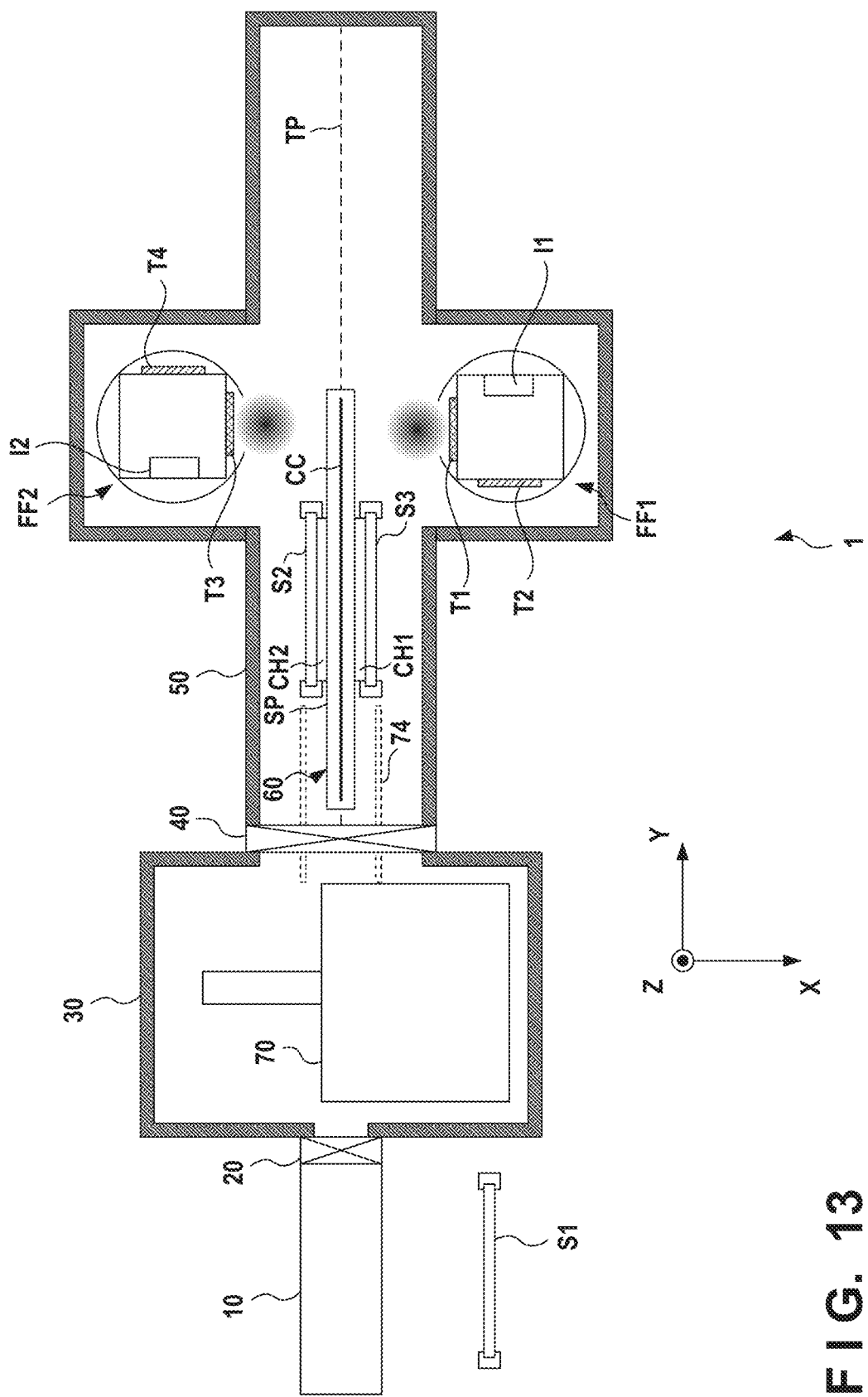
FIG. 13 is a view for explaining a detailed example of an operation according to one embodiment of the present invention.

Next, as schematically shown in FIG. 11, a gas is supplied to the deposition area to generate a plasma. A deposition material is ejected from the targets T1 and T3 to the deposition area by sputtering. Next, as schematically shown in FIGS. 12 and 13, the driving unit 110 moves the holding unit 60 holding the substrates S3 and S2 along the transport path TP in the −Y direction (second direction). First films are thus formed on the first surface of the substrate S3 and the second surface of the substrate S2. In addition, the substrate S1 discharged to the platform 10 is removed by the transportation mechanism (not shown).

As schematically shown in FIGS. 11 and 13, the separation unit SP provided on the holding unit 60 functions to separate the space on the side of the first deposition unit FF1 with the target T1 and the space on the side of the second deposition unit FF2 with the target T3 from each other. The separation unit SP contributes to, for example, suppression of film formation on the second deposition unit FF2 by the first deposition unit FF1 and film formation on the first deposition unit FF1 by the second deposition unit FF2. The separation unit SP also contributes to suppression of contamination between the first deposition unit FF1 and the second deposition unit FF2. Suppression of contamination is especially effective in a case in which the materials of the targets T1 and T3 are different from each other.

Figure 14:
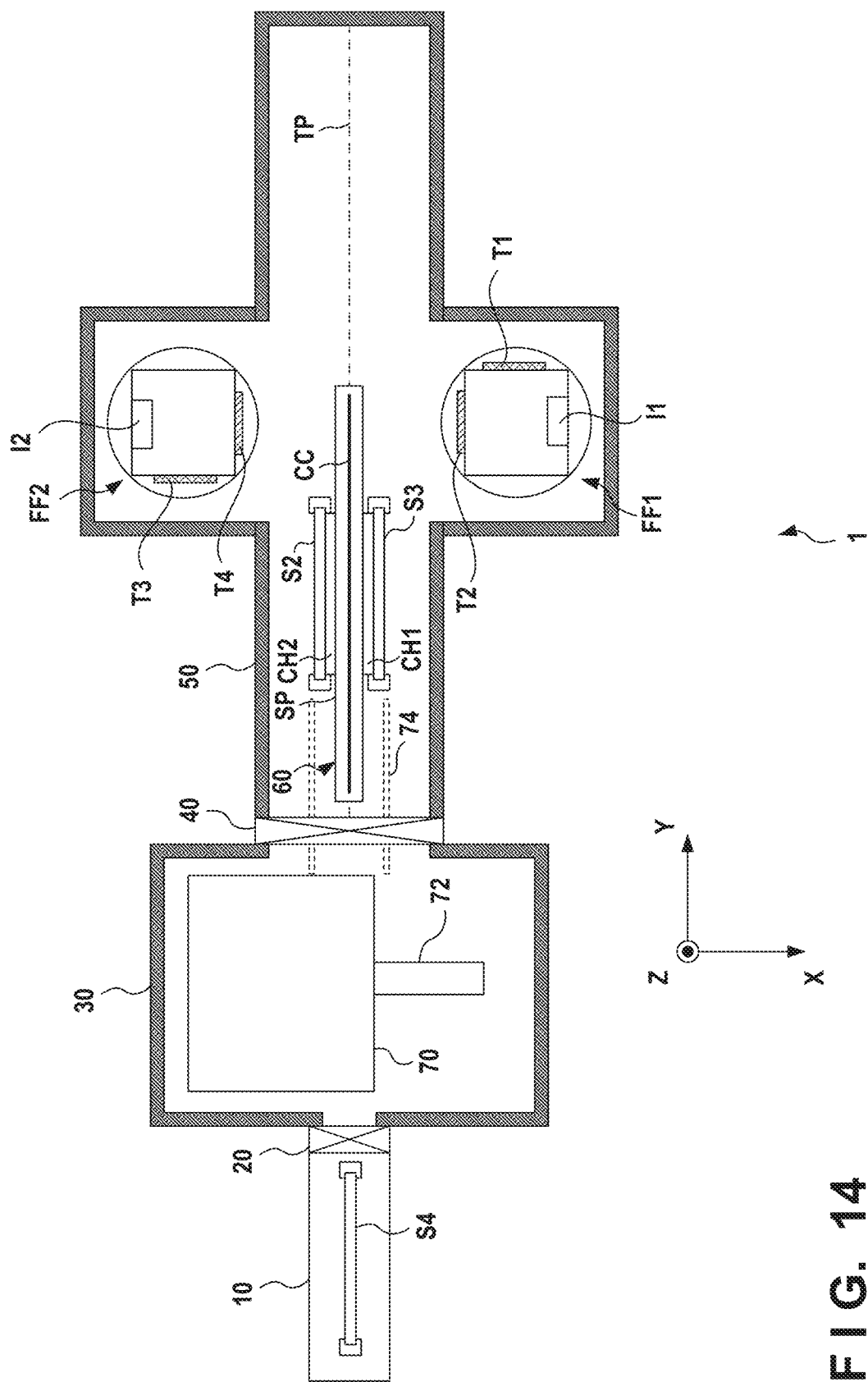
FIG. 14 is a view for explaining a detailed example of an operation according to one embodiment of the present invention.

Then, as schematically shown in FIG. 14, the new substrate S4 is provided to the platform 10, and the container 70 is operated by the operation mechanism 72 to a position capable of receiving the substrate S4. In addition, the targets T2 and T4 are directed to the deposition area.

Figure 15:
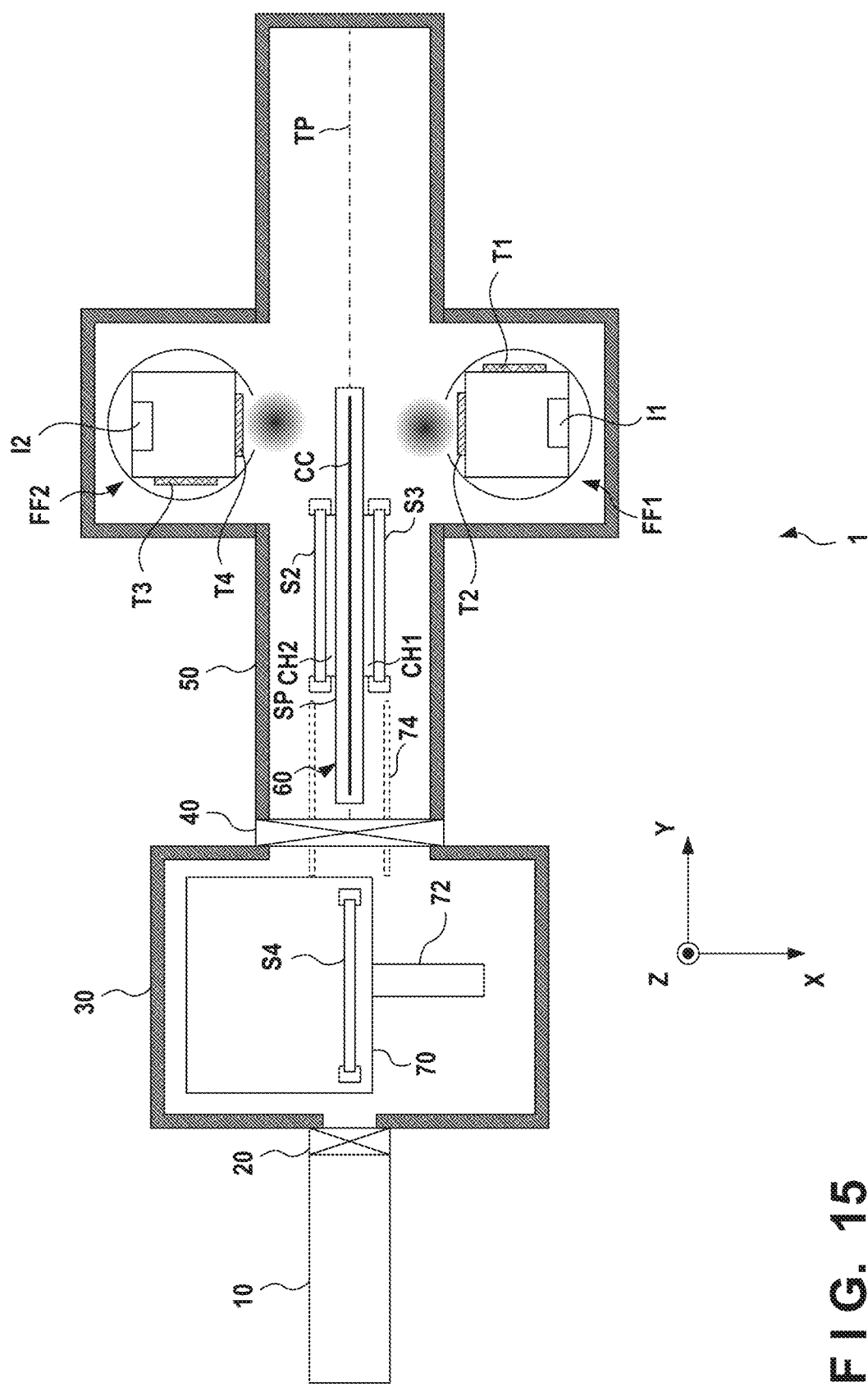
FIG. 15 is a view for explaining a detailed example of an operation according to one embodiment of the present invention.

Next, as schematically shown in FIG. 15, a gas is supplied to the deposition area to generate a plasma. A deposition material is ejected from the targets T2 and T4 to the deposition area by sputtering. In addition, the substrate S4 is transported from the platform 10 to the container 70 in the load lock chamber 30 by the transportation mechanism (not shown). After that, the pressure in the load lock chamber 30 is reduced. Additionally, the container 70 is operated by the operation mechanism 72 such that the container 70 can receive the substrates S2 and S3 later.

Figure 16:
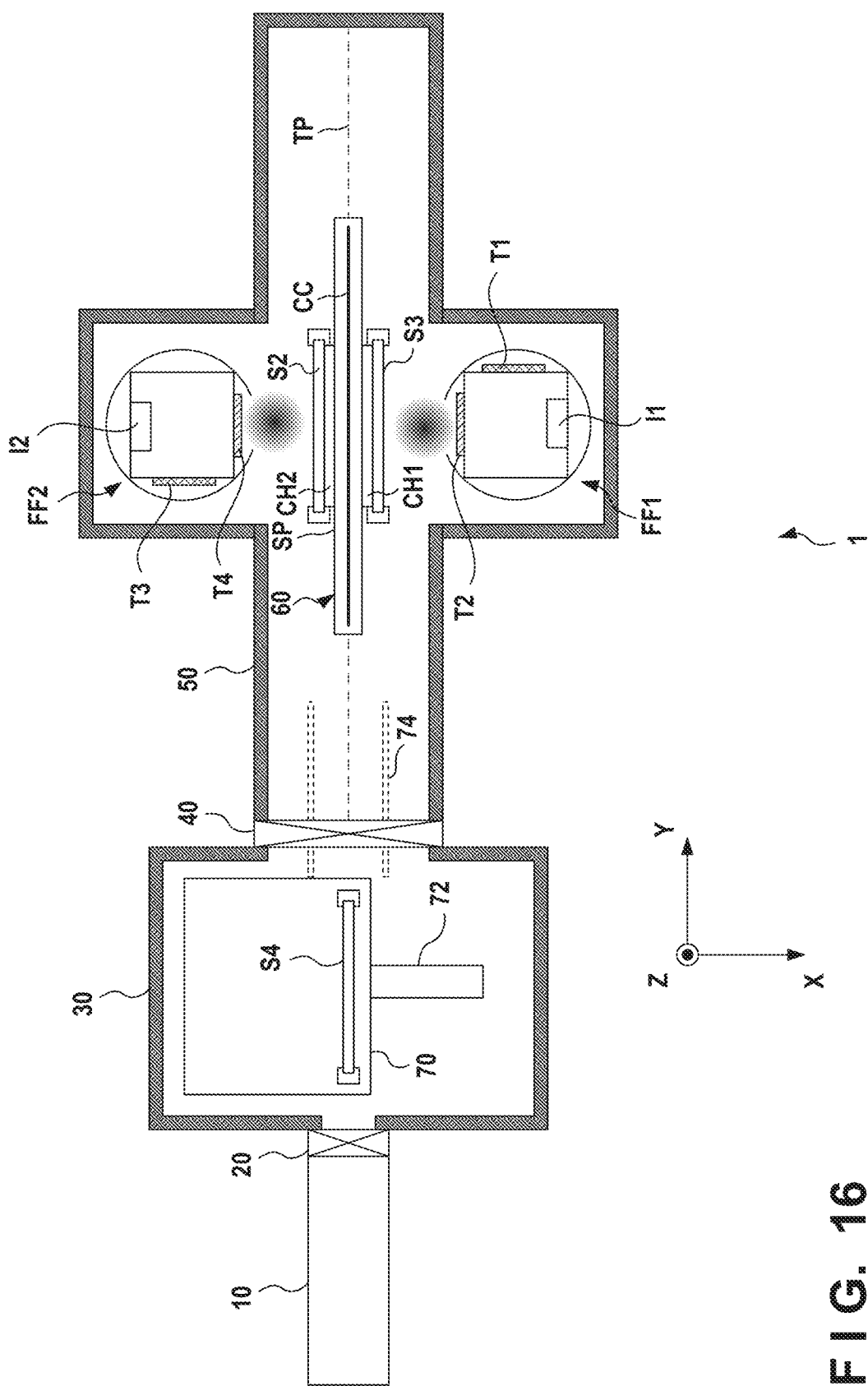
FIG. 16 is a view for explaining a detailed example of an operation according to one embodiment of the present invention.
Figure 17:
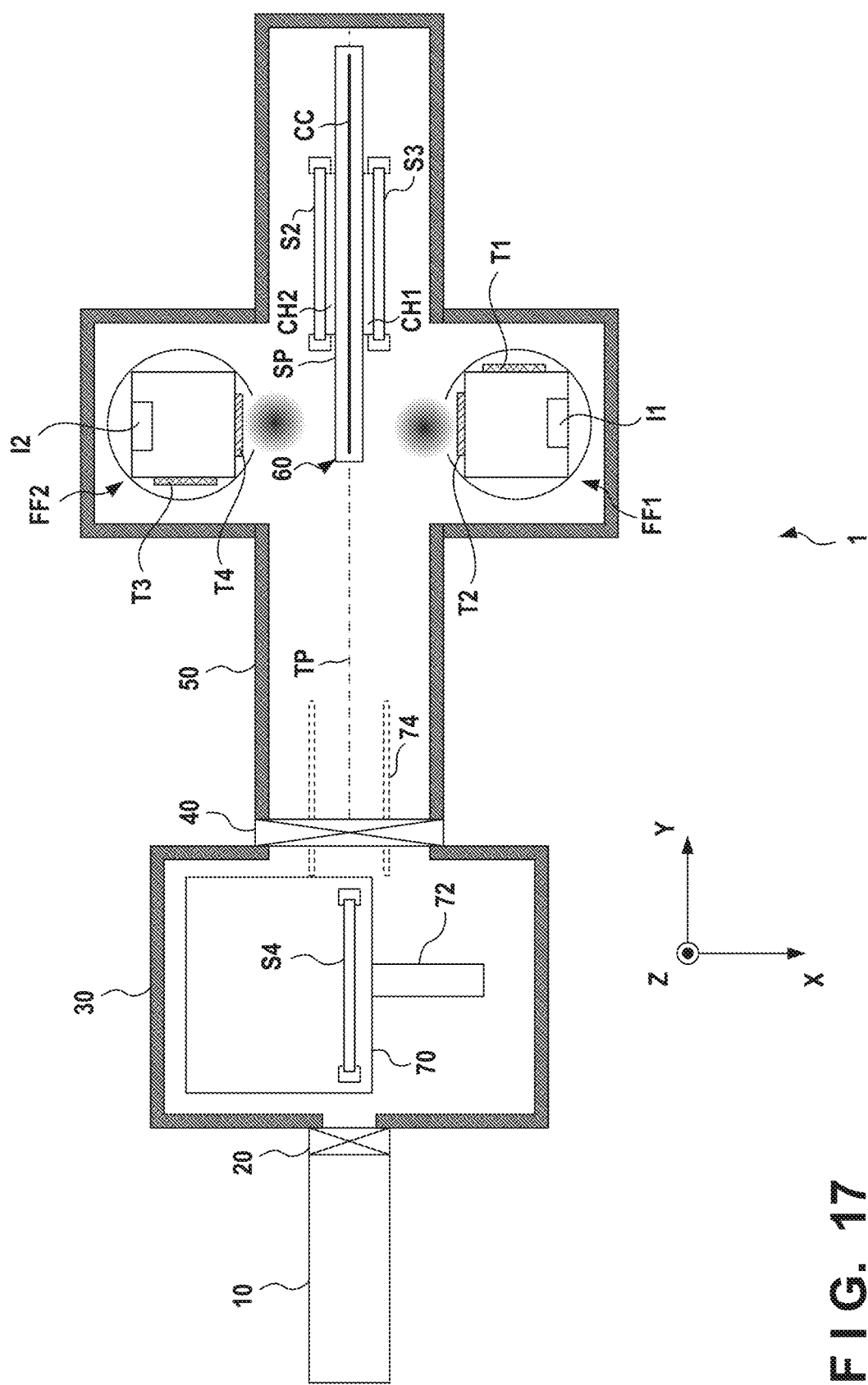
FIG. 17 is a view for explaining a detailed example of an operation according to one embodiment of the present invention.
Figure 18:
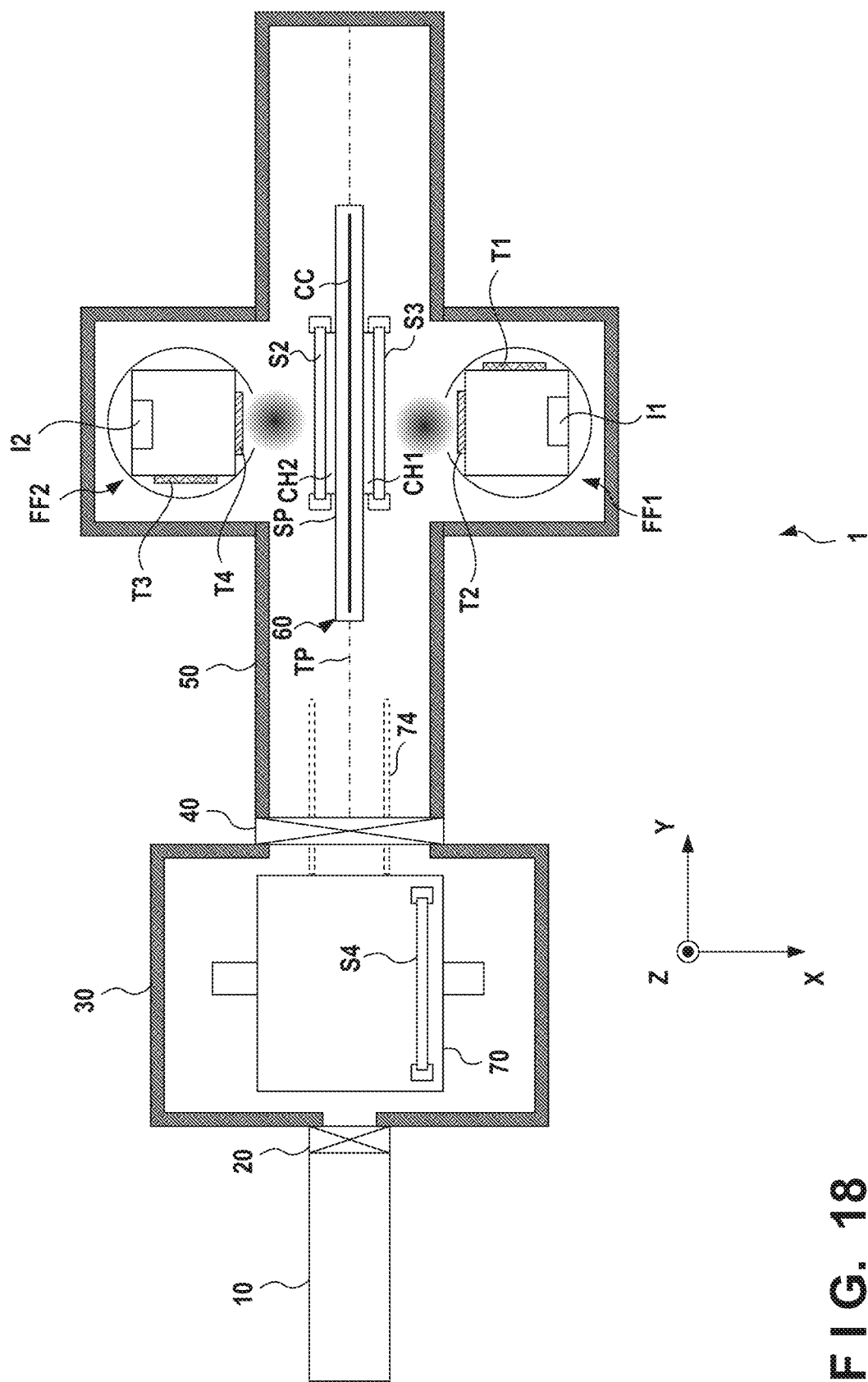
FIG. 18 is a view for explaining a detailed example of an operation according to one embodiment of the present invention.
Figure 19:
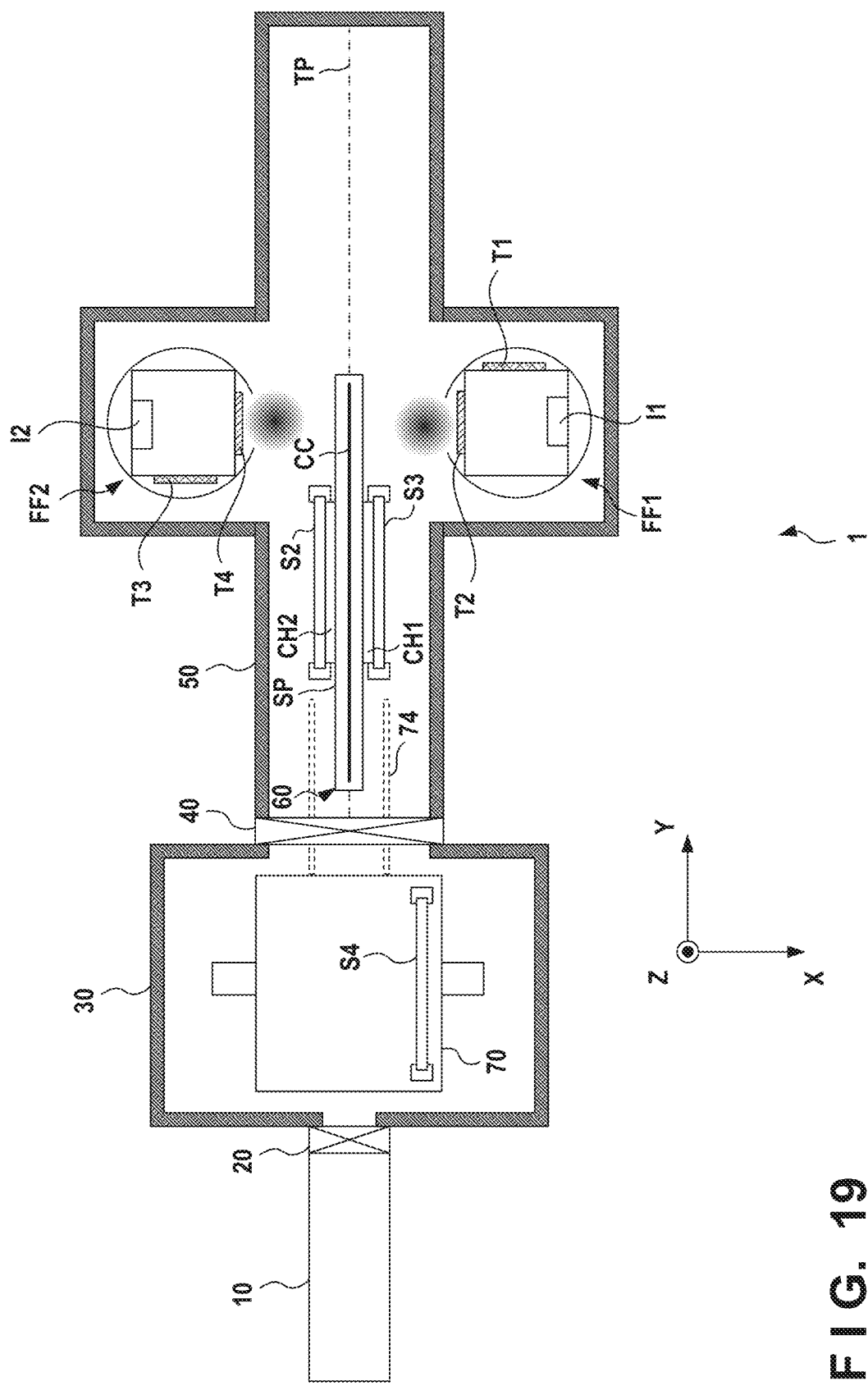
FIG. 19 is a view for explaining a detailed example of an operation according to one embodiment of the present invention.

Next, as schematically shown in FIGS. 16 and 17, the driving unit 110 moves the holding unit 60 holding the substrates S3 and S2 along the transport path TP in the +Y direction (first direction). Second films are thus formed on the first films on the first surface of the substrate S3 and the second surface of the substrate S2. Next, as schematically shown in FIGS. 18 and 19, the driving unit 110 moves the holding unit 60 holding the substrates S3 and S2 along the transport path TP in the −Y direction (second direction). Second films are thus further formed on the second films on the first surface of the substrate S3 and the second surface of the substrate S2.

Figure 20:
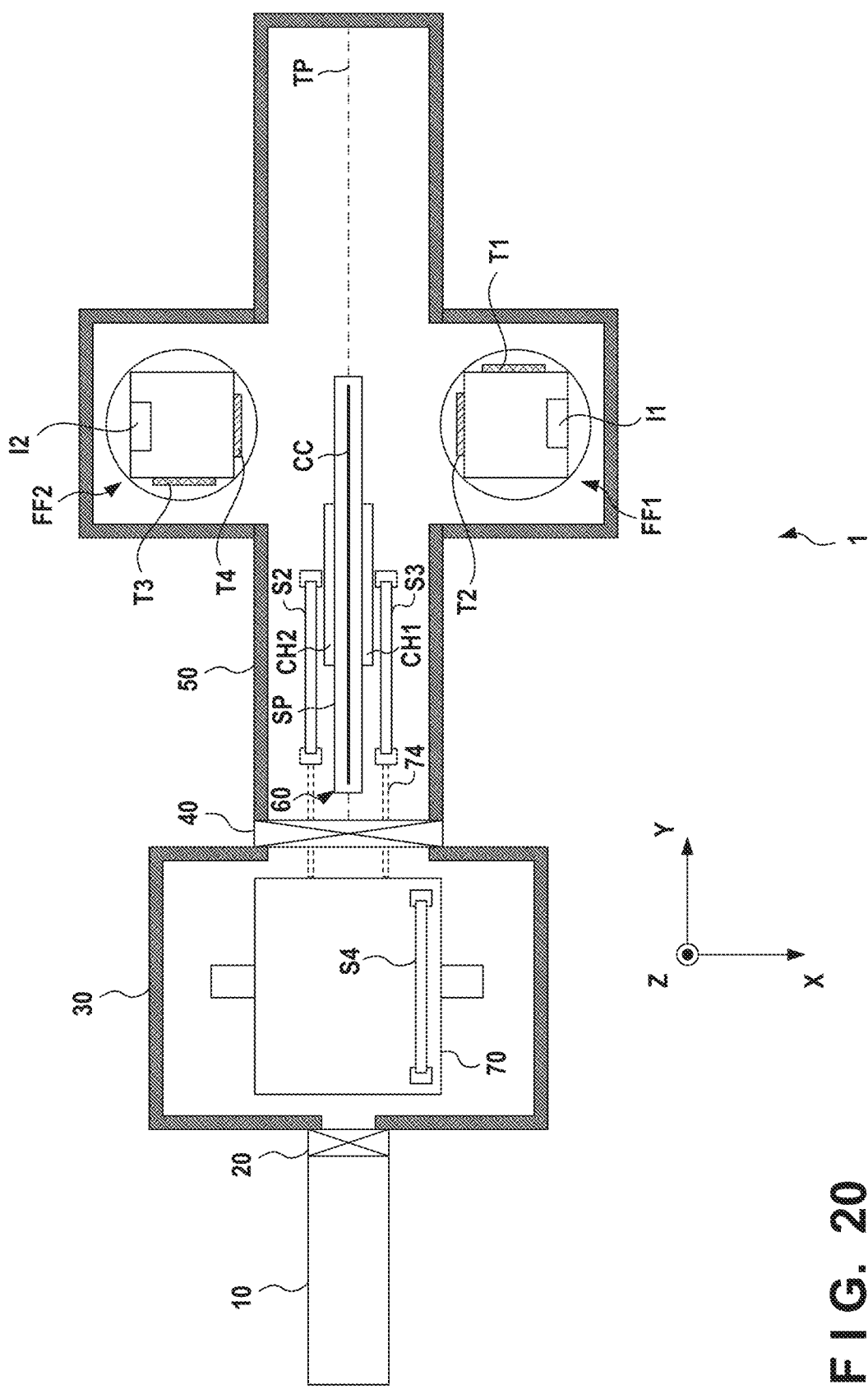
FIG. 20 is a view for explaining a detailed example of an operation according to one embodiment of the present invention.
Figure 21:
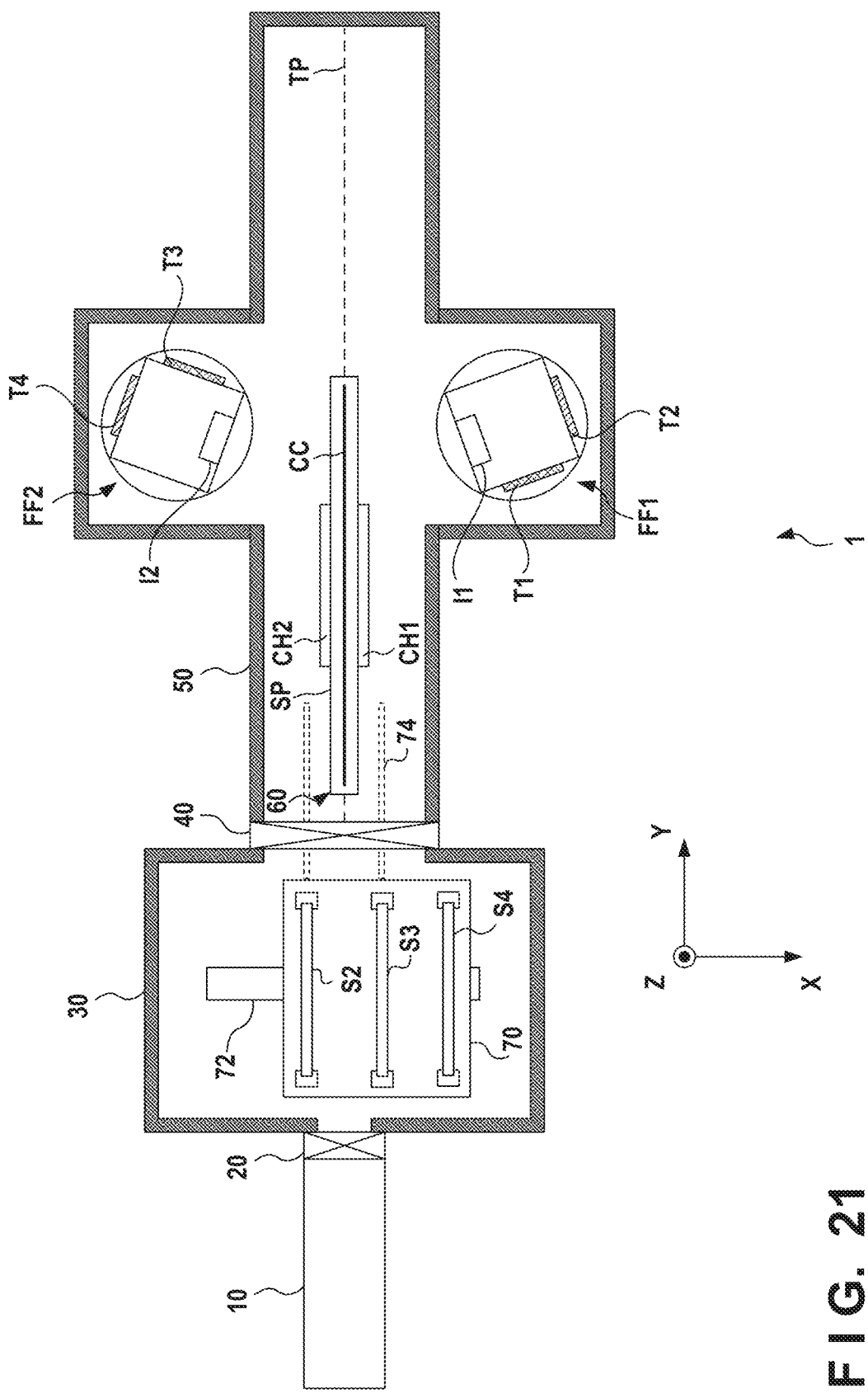
FIG. 21 is a view for explaining a detailed example of an operation according to one embodiment of the present invention.

Next, as schematically shown in FIGS. 20 and 21, the substrates S3 and S2 are detached from the first chuck CH1 and the second chuck CH2, respectively, and transported by the transportation mechanism 74 to the container 70 via the valve 40.

Figure 22:
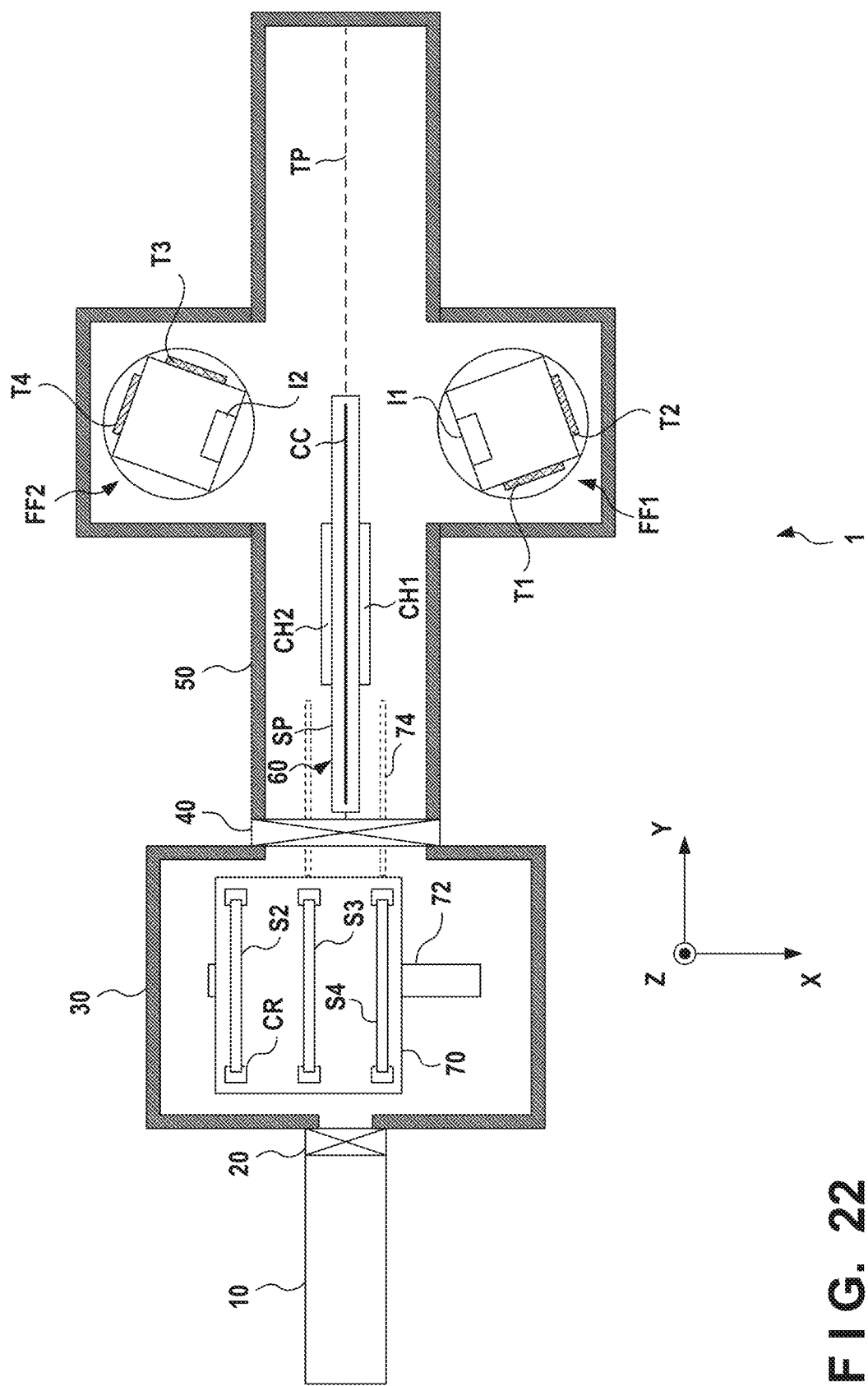
FIG. 22 is a view for explaining a detailed example of an operation according to one embodiment of the present invention.
Figure 23:
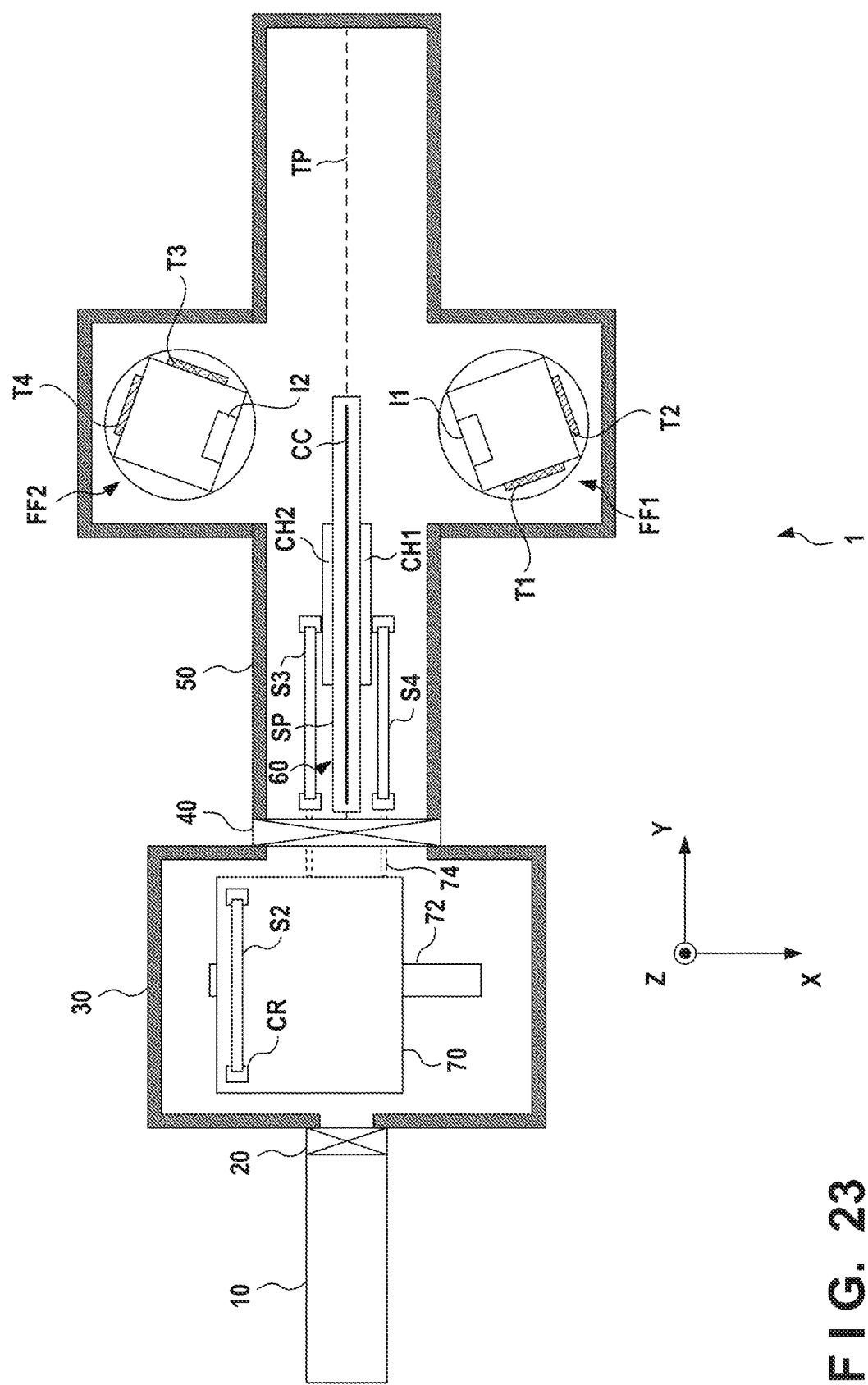
FIG. 23 is a view for explaining a detailed example of an operation according to one embodiment of the present invention.

Subsequently, the substrates are changed, and the above-described procedure is repeated. The beginning of the repetitive procedure will be described. As schematically shown in FIGS. 22 and 23, to simultaneously form films on the first surface of the substrate S4 and the second surface of the substrate S3, the substrates S4 and S3 in the container 70 are transported to the first chuck CH1 and the second chuck CH2 by the transportation mechanism 74 and held by the first chuck CH1 and the second chuck CH2, respectively.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE SIGNS LIST

50: chamber, 60: holding unit, S1, S2, S3, S4: substrate, CR: carrier, FFA: deposition area, 110: driving unit, TP: moving path, FF: deposition unit, FF1: first deposition unit, FF2: second deposition unit, CV: cooling unit, CC: cooling channel, CS: supply unit, CH1: first chuck, CH2: second chuck, SP: separation unit, 10: platform, 30: load lock chamber, 70: container, 72: operation mechanism, 74: transportation mechanism, 140: second driving unit, 120: hollow member, 130: bellows, 135: closing member

What is claimed is:
1. A deposition apparatus for forming a film on each of a first surface and a second surface of each of a plurality of substrates each having the first surface and the second surface, the apparatus comprising:
   a chamber;
   a holding unit including a first chuck and a second chuck, which are located on sides opposite to each other, and configured to, in the chamber, hold a side of the second surface of a first substrate by the first chuck and hold a side of the first surface of a second substrate by the second chuck;
   a driving unit configured to move the holding unit such that the first substrate and the second substrate respectively held by the first chuck and the second chuck pass through a deposition area in the chamber;
   a first deposition unit configured to form a film on the first surface of the first substrate held by the first chuck;
   a second deposition unit configured to form a film on the second surface of the second substrate held by the second chuck;
   an operation mechanism configured to, after the film is formed by the first deposition unit on the first surface of the first substrate with the side of the second surface held by the first chuck, operate the first substrate such that the side of the first surface of the first substrate is held by the second chuck; and
   a cooling unit configured to cool the holding unit.

2. The deposition apparatus according to claim 1, wherein the cooling unit includes a coolant channel arranged in the holding unit, and a supply unit configured to supply a coolant to the coolant channel.

3. The deposition apparatus according to claim 2, further comprising:

a bellows with one end connected to an opening provided in the chamber and the other end closed by a closing member; and a hollow member configured to connect the holding unit and the closing member, wherein the supply unit supplies the coolant from outside of the chamber to the holding unit via the hollow member.

4. The deposition apparatus according to claim 3, further comprising a second driving unit configured to move the closing member in accordance with an operation of the driving unit to move the holding unit.

5. The deposition apparatus according to claim 1, wherein the driving unit moves the holding unit along a moving path parallel to a process target surface of each of the first substrate and the second substrate.

6. The deposition apparatus according to claim 5, wherein the first deposition unit and the second deposition unit form the films on the first substrate and the second substrate while the first substrate and the second substrate move along the moving path in a first direction, and the first deposition unit and the second deposition unit form the films on the first substrate and the second substrate while the first substrate and the second substrate move along the moving path in a second direction that is a direction reverse to the first direction.

7. The deposition apparatus according to claim 1, wherein the first deposition unit and the second deposition unit simultaneously form films on the first surface of the first substrate held by the first chuck and the second surface of the second substrate held by the second chuck.

8. The deposition apparatus according to claim 1, wherein the holding unit includes a separation unit configured to separate a space on a side of the first deposition unit and a space on a side of the second deposition unit such that the first deposition unit and the second deposition unit do not face each other in a movable range of the holding unit while the film is formed.

9. The deposition apparatus according to claim 8, wherein the separation unit separates the space on the side of the first deposition unit and the space on the side of the second deposition unit such that the first deposition unit and the second deposition unit do not face each other throughout the movable range of the holding unit while the film is formed.

10. The deposition apparatus according to claim 1, comprising a transportation mechanism configured to transport the first substrate and the second substrate between the holding unit and the operation mechanism, wherein the driving unit moves the holding unit along the moving path, the transportation mechanism transports the first substrate and the second substrate in a direction parallel to the moving path, the operation mechanism is configured to move a container, and moves the container in a direction orthogonal to the moving path in a state in which the first substrate transported from the first chuck of the holding unit by the transportation mechanism is stored in the container, and the movement of the container by the operation mechanism in the state in which the first substrate transported from the first chuck is stored in the container is done such that the first substrate is transported from the container to the second chuck by the transportation mechanism.

11. The deposition apparatus according to claim 1, wherein the first deposition unit and the second deposition unit are configured to be able to form a plurality of types of films on the first substrate and the second substrate.

12. The deposition apparatus according to claim 1, wherein each of the first deposition unit and the second deposition unit includes a plasma generation unit configured to generate a plasma so as to supply the deposition material to the deposition area.

13. The deposition apparatus according to claim 12, wherein the first deposition unit and the second deposition unit form the films on the first substrate and the second substrate by sputtering.

14. The deposition apparatus according to claim 1, further comprising an ion gun configured to irradiate the first substrate and the second substrate passing through the deposition area with ions.

15. A deposition apparatus for forming a film on each of a first surface and a second surface of each of a plurality of substrates each having the first surface and the second surface, the apparatus comprising:

a chamber;

a holding unit including a first chuck and a second chuck, which are located on sides opposite to each other, and configured to, in the chamber, hold a side of the second surface of a substrate by the first chuck and hold a side of the first surface of a substrate by the second chuck;

a driving unit configured to move the holding unit such that the substrates respectively held by the first chuck and the second chuck pass through a deposition area in the chamber;

a first deposition unit configured to form a film on the substrate held by the first chuck;

a second deposition unit configured to form a film on the substrate held by the second chuck; and an operation mechanism configured to operate the substrate with the side of the second surface held by the first chuck and the film formed on the first surface by the first deposition unit such that the side of the first surface is held by the second chuck.

16. The deposition apparatus according to claim 15, further comprising a transportation mechanism configured to transport the substrate between the holding unit and the operation mechanism, wherein the driving unit moves the holding unit along the moving path, the transportation mechanism transports the substrate in a direction parallel to the moving path, the operation mechanism is configured to move a container, and moves the container in a direction orthogonal to the moving path in a state in which a first substrate transported from the first chuck of the holding unit by the transportation mechanism is stored in the container, and the movement of the container by the operation mechanism in the state in which the first substrate transported from the first chuck is stored in the container is done such that the first substrate is transported from the container to the second chuck by the transportation mechanism.

17. A deposition apparatus comprising:

a chamber;

a holding unit including a separator having a first surface and a second surface opposite to the first surface, a first chuck arranged on the first surface and configured to hold a substrate, and a second chuck arranged on the second surface and configured to hold a substrate;

a driving unit configured to move the holding unit such that the substrates respectively held by the first chuck and the second chuck pass through a deposition area in the chamber;

a first deposition unit configured to form a film on the substrate held by the first chuck; and a second deposition unit configured to form a film on the substrate held by the second chuck, wherein the separator is configured to separate a space on a side of the first deposition unit and a space on a side of the second deposition unit from each other such that the first deposition unit and the second deposition unit do not face each other throughout a movable range of the holding unit while the film is formed, and wherein an area of the first surface is larger than an area of the first chuck, and an area of the second surface is larger than an area of the second chuck.

\* \* \* \* \*